US007732352B2

(12) United States Patent
Mun et al.

(10) Patent No.: US 7,732,352 B2
(45) Date of Patent: Jun. 8, 2010

(54) SILICON WAFERS AND METHOD OF FABRICATING THE SAME

(75) Inventors: Young Hee Mun, Kumi-Shi (KR); Kun Kim, Kumi-Shi (KR); Chung Geun Koh, Seoul (KR); Seung Ho Pyi, Kyungki-Do (KR)

(73) Assignees: Hynix Semiconductor Inc., Icheon-si (KR); Siltron Inc., Gyeongsangbuk-do (KR)

( * ) Notice: Subject to any disclaimer, the term of this patent is extended or adjusted under 35 U.S.C. 154(b) by 435 days.

(21) Appl. No.: 11/765,973

(22) Filed: Jun. 20, 2007

(65) Prior Publication Data

US 2007/0298523 A1 Dec. 27, 2007

Related U.S. Application Data

(62) Division of application No. 10/699,438, filed on Oct. 31, 2003, now Pat. No. 7,242,075.

(30) Foreign Application Priority Data

Sep. 5, 2003 (KR) .............................. 2003-62283

(51) Int. Cl.
*H01L 21/324* (2006.01)
*H01L 21/322* (2006.01)
(52) U.S. Cl. .............................. 438/795; 117/2; 117/3
(58) Field of Classification Search .................. 117/2, 117/3; 438/795
See application file for complete search history.

(56) References Cited

U.S. PATENT DOCUMENTS 4,868,133 A * 9/1989 Huber ........................ 438/471

(Continued)

FOREIGN PATENT DOCUMENTS

CN 1256723 6/2000

(Continued)

OTHER PUBLICATIONS

Office Action issued by Korean Intellectual Property Office (dated May 27, 2005) for counterpart priority application KR 10-2003-062283.

(Continued)

*Primary Examiner*—Mary Wilczewski
(74) *Attorney, Agent, or Firm*—Marshall, Gerstein & Borun LLP

(57) ABSTRACT

By using a two-step RTP (rapid thermal processing) process, the wafer is provided which has an ideal semiconductor device region secured by controlling fine oxygen precipitates and OiSFs (Oxidation Induced Stacking Fault) located on the surface region of the wafer. By performing the disclosed two-step rapid thermal process, the distribution of defects can be accurately controlled and an ideal device active zone can be formed up to a certain distance from the surfaces of the wafer. In addition, it is possible to maximize the internal gettering (IG) efficiency by enabling the oxygen precipitates and the bulk stacking faults to have constant densities in the depth direction in an internal region of the wafer, that is, the bulk region. In order to obtain the constant concentration profile of the oxygen precipitates and the bulk stacking faults in the bulk region, the wafer is subjected to the aforementioned two-step rapid thermal process in a predetermined mixed gas atmosphere.

23 Claims, 21 Drawing Sheets

U.S. PATENT DOCUMENTS

| | | | |
|---|---|---|---|
| 5,401,669 A * | 3/1995 | Falster et al. | 438/476 |
| 5,403,406 A | 4/1995 | Falster et al. | |
| 5,502,010 A | 3/1996 | Nadahara et al. | 438/795 |
| 5,502,331 A | 3/1996 | Inoue et al. | 257/617 |
| 5,994,761 A | 11/1999 | Falster et al. | |
| 6,139,625 A * | 10/2000 | Tamatsuka et al. | 117/19 |
| 6,245,311 B1 * | 6/2001 | Kobayashi et al. | 423/348 |
| 6,336,968 B1 * | 1/2002 | Falster | 117/2 |
| 6,339,016 B1 | 1/2002 | Torack et al. | 438/584 |
| 6,413,310 B1 * | 7/2002 | Tamatsuka et al. | 117/3 |
| 6,485,807 B1 | 11/2002 | Park | |
| 6,503,594 B2 * | 1/2003 | Park | 428/64.1 |
| 6,573,159 B1 * | 6/2003 | Kobayashi et al. | 438/471 |
| 6,641,888 B2 | 11/2003 | Asayama et al. | |
| 6,642,123 B2 * | 11/2003 | Mun et al. | 438/402 |
| 6,663,708 B1 | 12/2003 | Morita et al. | |
| 6,680,260 B2 * | 1/2004 | Akiyama et al. | 438/766 |
| 6,803,331 B2 * | 10/2004 | Holzl et al. | 438/795 |
| 7,011,717 B2 * | 3/2006 | Kobayashi et al. | 148/33 |
| 7,078,357 B2 * | 7/2006 | Tobe et al. | 438/795 |
| 7,081,422 B2 | 7/2006 | Hayamizu et al. | 438/795 |
| 7,135,351 B2 * | 11/2006 | Binns et al. | 438/58 |
| 7,242,075 B2 * | 7/2007 | Mun et al. | 257/611 |
| 7,442,253 B2 * | 10/2008 | Falster et al. | 117/89 |
| 7,485,928 B2 * | 2/2009 | Falster et al. | 257/347 |
| 2002/0100410 A1 | 8/2002 | Kim et al. | 117/13 |
| 2003/0013321 A1 * | 1/2003 | Hayamizu et al. | 438/795 |
| 2005/0054124 A1 | 3/2005 | Mun et al. | 438/12 |
| 2005/0247259 A1 | 11/2005 | Yoon et al. | 117/13 |

FOREIGN PATENT DOCUMENTS

| | | |
|---|---|---|
| KR | 10-2002-0052562 | 7/2002 |
| KR | 2002-0052565 | 7/2002 |
| KR | 10-2003-0002300 | 1/2003 |
| KR | 2003-0002300 | 1/2003 |
| WO | WO 98-45507 | 10/1998 |
| WO | WO 98/45507 | 10/1998 |
| WO | WO 98/45508 | 10/1998 |
| WO | WO 98/45509 | 10/1998 |
| WO | WO 2004/070824 A1 * | 8/2004 |

OTHER PUBLICATIONS

Office Action from the Chinese Patent Office for Chinese Application No. 200410005410.1, corresponding to U.S. Appl. No. 10/699,438.
English translation of the office action for Chinese Application No. 200410005410.1.

* cited by examiner (a) Vacancy (□)   (b) Interstitial Silicon (•)   (c) Interstitial Oxygen (○)
(d) Oxygen Precipitate (◉)   (e) Bulk Stacking Fault (●)

SILICON WAFERS AND METHOD OF FABRICATING THE SAME

CROSS REFERENCE TO RELATED APPLICATIONS

This is a divisional of U.S. application Ser. No. 10/699,438 (the disclosure of which is incorporated herein by reference in its entirety), filed Oct. 31, 2003, now U.S. Pat. No. 7,242,075 which claims foreign priority from Korean Application No. KR 2003-62283, filed Sep. 5, 2003.

BACKGROUND

1. Technical Field

Improved silicon wafers and methods of fabricating silicon wafers are disclosed. More specifically, silicon wafers with an ideal device active zones formed up to a certain distance from the front and rear surfaces of the wafer and with an internal region that has a constant density of oxygen precipitates and bulk stacking faults in a depth direction and a method of fabricating the silicon wafer are disclosed.

2. Description of the Related Art

Generally known defects causing problems in a silicon wafer include COPs (Crystal Originated Particle), FPDs (Flow Pattern Defect), and LSTDs (Laser Scattering Tomography Defect).

The COPs formed in a surface layer of the wafer are detected by repeating a cleaning process with a mixed solution (Standard Cleaning 1 solution) of ammonia and hydrogen peroxide. The COPs have sizes in a range of about 0.09 µm to about 0.12 µm and are observed in shapes of pits on the surface of the wafer. The COPs are known to be a type of defects which are induced at the time of pulling the crystal to form the wafer.

The FPDs which are related to the dielectric strength of an oxide film are known to be detected in a flow pattern by performing a selective etching process using an etchant such as hydrochloride solution or potassium dichromate solution.

The LSPDs which are observed as fine defects generated during the crystal growing process are known to be detected by a laser scattering tomography.

Typically, a method of fabricating a silicon wafer comprises a single crystal growing process for preparing a single crystal ingot, a slicing process for slicing the single crystal into wafers having a shape of a thin disk, a chamfering process for chamfering a circumferential edge portion of the wafer to prevent the wafer obtained in the slicing process from being broken and deformed, a lapping process for planarizing the wafer, a polishing process for polishing the surface of the wafer into a mirror, and a cleaning process for cleaning the polished wafer to remove polishing powders and contaminating particles attached on the wafer.

Silicon wafers fabricated by performing the aforementioned processes on the silicon single crystal which is grown by the so-called Czochralski (CZ) method contain large amounts of oxygen impurities. The oxygen impurities may be changed into oxygen precipitates which cause dislocations or defects. The presence of the oxygen precipitates on the surface where semiconductor devices are to be formed results in increasing leakage currents and weakening the dielectric strength of the oxide film, so that it can have a great effect on the properties of the semiconductor devices.

Silicon wafers fabricated in accordance with the aforementioned method need to secure the so-called "denuded zone" (DZ) up to a predetermined depth from the surface of the wafer. Herein, the denuded zone is a region in which no dislocations, stacking faults, oxygen precipitates, etc., exist from the front to the back of the wafer. However, in silicon wafers fabricated in accordance with the conventional method, the oxygen precipitates which are formed in surface regions function as sources of the leakage currents.

FIG. 1 is a view illustrating a concentration profile of defects of the silicon wafer which is obtained by growing an ingot and slicing the ingot in accordance to the general method. As shown in FIG. 1, the concentration of defects is highest at the central portion and is lower toward the surface of the wafer, so that the concentration profile has a shape of convex.

On the other hand, the aforementioned void defects and internal defects such as oxygen precipitates can be controlled by thermal treatment processes after the crystal growing process. One of the thermal treatment processes is a process using a diffusion furnace. In case of the process using the diffusion furnace, the thermal treatment process is performed in a $H_2$ or Ar atmosphere at a high temperature of 1200° C. or more for one hour or more, and then, a device perfect zone is formed on some of the surface region of the wafer by means of the out-diffusion of the oxygen and the rearrangement of the silicon. In accordance with the conventional method using the diffusion furnace, a layer without any void defects and fine oxygen precipitates can be formed from the surface to the depth of 10 µm of the wafer. However, as the diameter of the wafer is getting larger and larger, the conventional method does not effectively control slip dislocations which are formed on the wafer due to a high-temperature thermal treatment process or contaminants which are formed due to the high-temperature thermal treatment process.

SUMMARY OF THE DISCLOSURE

A silicon wafer is disclosed which is capable of securing sufficient denuded zones near the front and back surfaces of the wafer and which has a bulk region having a substantially constant concentration distribution of bulk stacking faults over the entire bulk stacking region to thereby function as gettering sites.

A method of fabricating a silicon wafer is also disclosed which is capable of securing sufficient denuded zones near the wafer front surface and which provides a bulk region on the wafer which has a constant concentration distribution of bulk stacking faults over the entire bulk stacking region to function as gettering sites.

In a silicon wafer having a front surface, a back surface, a circumferential edge portion, and a region between the front and back surfaces, the disclosed silicon wafer comprises: a first denuded zone being formed up to a predetermined distance from the front surface; a second denuded zone being formed up to a predetermined distance from the back surface; and a bulk region being formed between the first and second denuded zones, wherein a concentration profile of defects in the bulk regions has a distribution which is maintained constant in the direction from the front surface to the back surface.

In refinement, the defects may be bulk micro-defects (BMD) including oxygen precipitates and bulk stacking faults. Preferably, the concentration of the defects in the region between the first and the second denuded zones may have a distribution which is maintained constant in a range of about $3.0 \times 10^8$ ea/cm$^3$ to about $1.0 \times 10^{10}$ ea/cm$^3$.

The defects may be bulk stacking faults. Preferably, the concentration of the defects in the region between the first and the second denuded zones may have a distribution which is maintained constant in a range of about $1.0\times10^8$ ea/cm$^3$ to $3.0\times10^9$ ea/cm$^3$.

Preferably, the depths of the first and the second denuded zones may be in a range of 5 μm to 40 μm from the front and back surfaces of the wafer. Preferably, the first and the second denuded zones may be defectless regions in which oxygen precipitates and bulk stacking faults are removed.

In another refinement, a silicon wafer is provided which has a front surface, a back surface, a circumferential edge portion, and a region between the front and back surfaces, wherein the region between the front and back surfaces comprises: a first denuded zone being formed up to a predetermined distance from the front surface; a second denuded zone being formed up to a predetermined distance from the back surface; and a bulk region being formed between the first and second denuded zones, wherein a concentration profile of defects between the front and back surfaces of the wafer has a stepped shape having an axial symmetry at the center between the front and back surfaces of the wafer, wherein the bulk region has vertically-rising concentration gradients at boundaries of the first and second denuded zones and a substantially horizontal concentration gradient over the entire bulk region, and wherein a concentration profile of defects in the bulk region has a planar shape within a range of variation of about 10%.

In another refinement, a disclosed method of fabricating a silicon wafer comprised: preparing a silicon wafer having a front surface, a back surface, a circumferential edge portion, and a bulk region between the front and back surfaces; performing a first rapid thermal process to consume vacancies in the silicon wafer, thereby accelerating a formation of nuclei of oxygen precipitate; and performing a second rapid thermal process to remove the nuclei of the oxygen precipitates located in a region near a front surface of the silicon wafer and to further accelerate the growth of the nuclei of the oxygen precipitates located in the bulk region of the silicon wafer.

It is preferable that the performing of the second rapid thermal process is carried out at a higher temperature than that of the step of performing the first thermal process.

It is also preferable that the performing of the first rapid thermal process is carried out at a temperature in a range from about 1120° C. to about 1180° C.

It is also preferable that the performing of the second rapid thermal process is carried out at a temperature in a range from about 1200° C. to about 1230° C.

It is also preferable that the step of performing the first rapid thermal process is carried out for a time period in a range of about 1 second to about 5 seconds.

It is also preferable that the performing of the second rapid thermal process is carried out for a time period in a range of about 1 second to about 10 seconds.

It is also preferable that the performing of the first rapid thermal process utilizes a mixture as of argon gas and ammonia gas.

It is also preferable that the performing of the second rapid thermal process utilizes a mixture of argon gas and ammonia gas.

The performing of the first rapid thermal process and the step of performing the second rapid thermal process may be carried out in-situ in the same apparatus.

The performing of the first rapid thermal process and the step of performing the second rapid thermal process may be carried out ex-situ.

The preparing of the silicon wafer may further comprise: growing a silicon single crystal by immersing a seed crystal into a melt silicon and pulling the seed crystal while controlling a crystal growing rate and a temperature gradient in a growing direction at a crystal coagulation interface; slicing the grown silicon single crystal into a shape of wafers; and performing an etching process for removing slicing damages originated from the slicing step, and rounding a side surface of the sliced wafer or etching the surface.

Preferably, the first and second rapid thermal processes are carried out in a donor killing process for converting an oxygen which is generated in the silicon wafer at the time of the crystal growth into an oxygen precipitates in order to prevent the oxygen from emitting an electron in a subsequent thermal treatment process and functioning as a donor.

After the performing of the second rapid thermal process, the method may further comprise: polishing the surface of the silicon wafer; performing a mirror surface polishing process on the surface of the silicon wafer; and cleaning the silicon wafer.

After performing of the first rapid thermal process and the performing of the second rapid thermal process, the resulting region between the front and back surfaces may comprise: a first denuded zone being formed up to a predetermined distance from the front surface; a second denuded zone being formed up to a predetermined distance from the back surface; and a bulk region being formed between the first and second denuded zones, and wherein a concentration profile of defects in the bulk region has a distribution which is maintained constant.

Another disclosed method for fabricating a silicon wafer comprises: (a) preparing a silicon wafer having a front surface, a back surface, a circumferential edge portion, and a region between the front and back surfaces; (b) loading the silicon wafer in a rapid thermal processing apparatus; (c) raising an internal temperature of the rapid thermal processing apparatus rapidly up to a first temperature of target; (d) performing a first rapid thermal process at the first temperature for a time period which is needed to consume vacancies in the silicon wafer, thereby accelerating a formation of nuclei of oxygen precipitates; (e) dropping the internal temperature of the rapid thermal processing apparatus rapidly down to a second temperature; (f) raising the internal temperature of the rapid thermal processing apparatus rapidly up to a third temperature which is higher than the first temperature; (g) performing a second rapid thermal process for maintaining the third temperature for a time period which is needed to remove the nuclei of the oxygen precipitates located in a region on a surface of the wafer or near the surface of the wafer and to further accelerate the growth of the nuclei of the oxygen precipitates located in the bulk regions of the silicon wafer; and (h) dropping the internal temperature of the rapid thermal processing apparatus rapidly down to a fourth temperature.

It is preferable that during parts (b) to (h), argon gas is continuously supplied, during the step (d), ammonia gas is supplied, and during the steps (e) to (h), the supplying of the ammonia gas is blocked.

It is preferable that the steps (b) to (h) are carried out in a donor killing process for converting an oxygen which is generated in the silicon wafer at the time of the crystal growth into an oxygen precipitates in order to prevent the oxygen from emitting an electron in a subsequent thermal treatment process and functioning as a donor.

Preferably, after part (h), the method may further comprise: unloading the silicon wafer from the rapid thermal processing apparatus; polishing the surface of the silicon wafer; performing a mirror surface polishing process on the surface of the silicon wafer; and cleaning the silicon wafer.

Preferably, after part (h), the region between the front and back surfaces may comprises: a first denuded zone being formed up to a predetermined distance from the front surface; a second denuded zone being formed up to a predetermined distance from the back surface; and a bulk region being formed between the first and second denuded zones, and wherein a concentration profile of defects in the bulk regions has a distribution which is maintained constant.

DETAILED DESCRIPTION OF THE PRESENTLY PREFERRED EMBODIMENTS

Certain preferred embodiments will be described with reference to the accompanying drawings. Since these embodiments are provided only for the purpose of providing those of ordinary skilled in the art with an understanding of this disclosure, it will be noted that they may be modified in various manners and that the scope of this disclosure is not limited by the embodiment described herein.

By using a two-step RTP (rapid thermal processing) process, a wafer with an ideal semiconductor device region is provided by controlling fine oxygen precipitates and OiSFs (Oxidation Induced Stacking Fault) located on the surface region of the wafer. By performing the two-step rapid thermal process, the distribution of defects can be accurately controlled and an ideal device active zone can be formed up to a certain depth from the surface of the wafer. In addition, it is possible to maximize the internal gettering (IG) efficiency by enabling the oxygen precipitates and the bulk stacking faults to have constant densities in the depth direction in an internal region of the wafer, that is, the bulk region. In order to obtain the desired concentration profile of the oxygen precipitates and the bulk stacking faults in the bulk region, the wafer is subjected to the aforementioned two-step rapid thermal process in a predetermined mixed gas atmosphere. By doing so, an OiSF ring or an OiSF disk is formed on the surface of the wafer or near the surface of the wafer, so that it is possible to secure an ideal device active region near the surface of the wafer and fabricate the wafer having a constant distribution of the oxygen precipitates and the bulk stacking faults having a high density.

Figure 1:
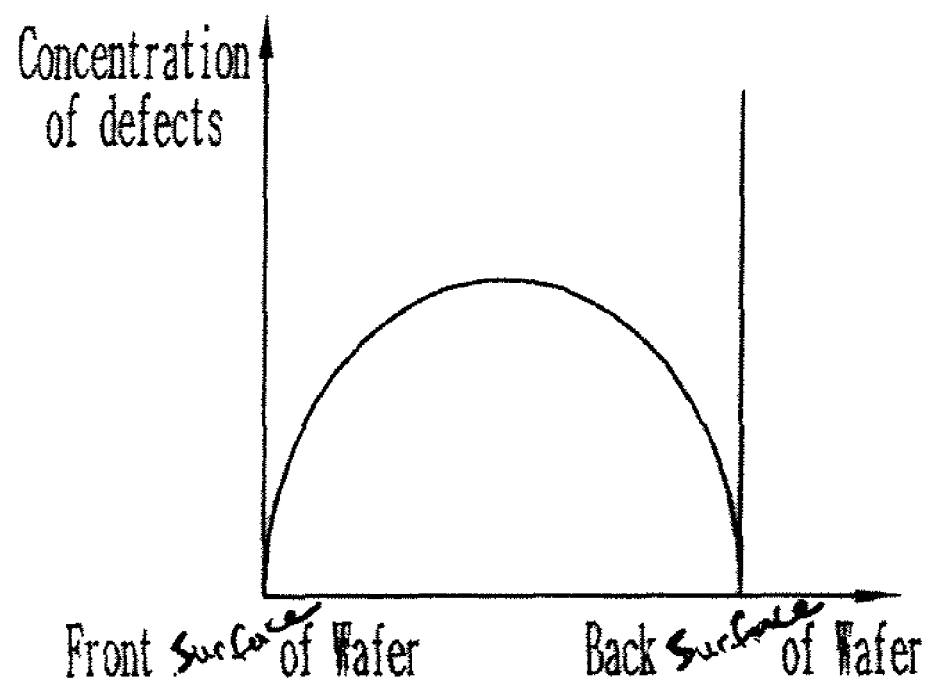
FIG. 1 graphically illustrates a concentration profile of defects of a silicon wafer which is fabricated with a conventional method.
Figure 2:
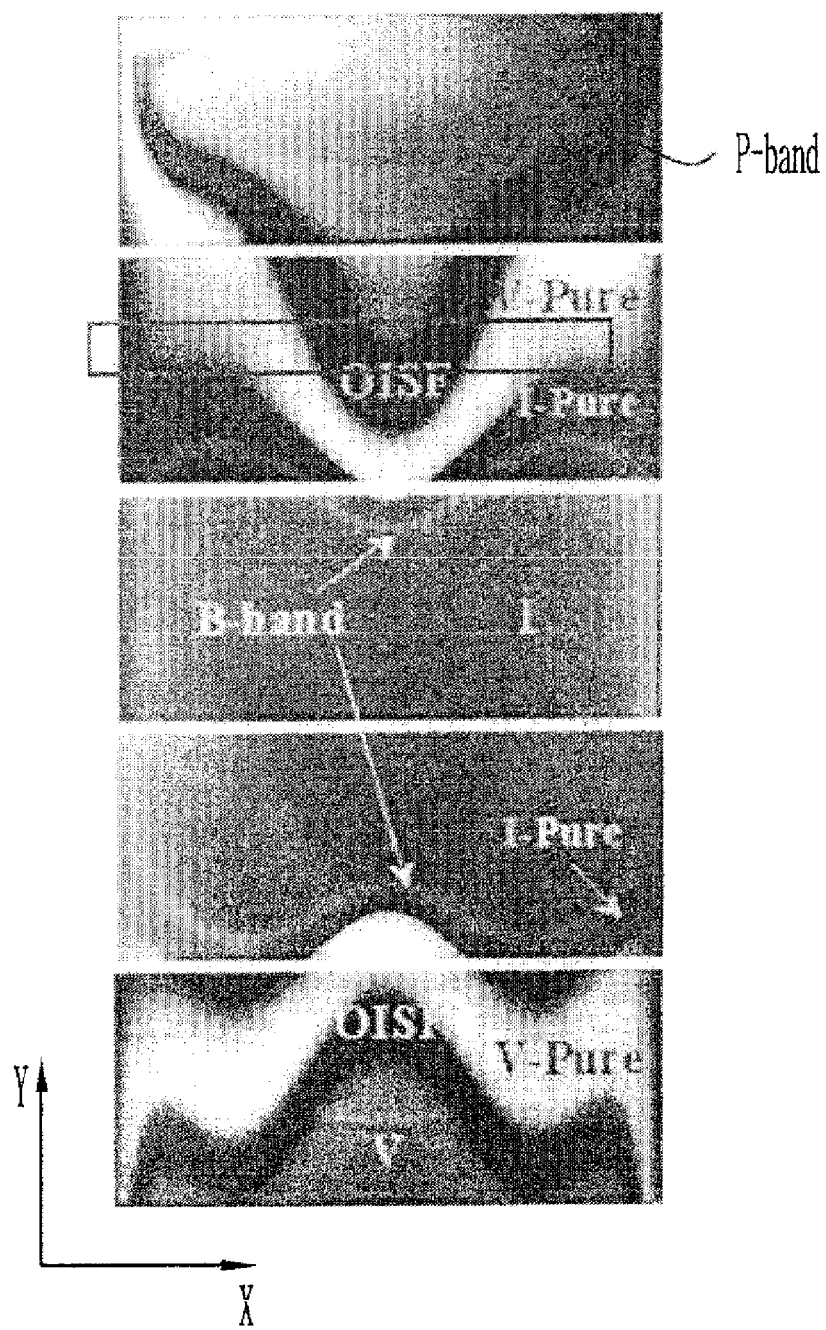
FIG. 2 illustrates a defect region formed with properties of point defects in a silicon single crystal.

FIG. 2 is a view illustrating a defect region formed with properties of point defects in the silicon single crystal and results of XRT (X-ray Topography) measurements on phenomena which occur in cases of the pulling rates of the single crystal being varied. In general, mass produced silicon wafers are fabricated by slicing some portions of the ingot. FIG. 2 shows results of the measurements while the ingot is sliced in the central axial direction, that is, the growing direction of the silicon single crystal. Herein, X-axis indicates the line from an edge point to the counterpart edge point of the ingot, and Y-axis indicates the growing direction of the silicon single crystal. In FIG. 2, the region indicated by "V" is a vacancy rich region, and the region indicated by "I" is an interstitial rich region. In addition, the region indicated by "V-Pure" is a vacancy pure region, and the region indicated by "I-Pure" is an interstitial pure region.

The disclosed techniques are closely related to crystal properties which, in turn, are dependent upon crystal growing techniques. As shown in FIG. 2, the crystal properties are dependent on the crystal growing conditions. However, it is difficult to find the crystal growing condition that ideally controls the P-Band to completely remove crystal growing defects, as shown in FIG. 2. Moreover, even though such a crystal growing condition is successfully found, since variations in the width of the pulling rate of the crystal is very short at the time of growing the crystal, the OiSF ring trace (see FIG. 3a) or the OiSF disk (see FIG. 3b) is generated by even a slight change of the variation width of the pulling rate of the crystal. Even in a wafer having crystal properties in which the crystal growing defects are completely controlled, the OiSF trace still remains on the wafer. The OiSF trace appears on the surface region of the wafer through the semiconductor device fabricating processes, so that the OiSF results in a cause of device failure.

In general, in order to fabricate the silicon wafer, the silicon single crystal is grown by the Czochralski (CZ) method. The silicon single crystal is divided into some defect regions in accordance with types of the crystal growing defects which are formed in the crystal growing processes since the defect regions have different oxygen precipitation behaviors.

In FIG. 2, the crystal growing defect regions formed in the silicon single crystal are shown to be divided. FIG. 2 is the results of XRT (X-ray Topography) measurements on the wafers obtained by growing silicon single crystals while varying the crystal growing rates of the crystals, slicing the silicon single crystals, and performing oxygen precipitation thermal treatment process. In FIG. 2, differences of the contrasts among the defect regions indicate degrees of scattering of the X-ray in accordance with the degrees of the oxygen precipitations. By doing so, it is possible to compare the degree of the oxygen precipitations of the defect regions. The change of vacancy and interstitial silicon behaviors in accordance with the crystal growing rates (V) and the temperature gradients in the growing direction at the coagulation interfaces of the crystals has an influence on the formation of the other defect regions in the silicon single crystals.

If the value of V/G is greater than a threshold value ξ, the vacancy rich region where the vacancies occur as the dominant point defects is formed. The defects which appear in the vacancy rich region are classified into COPs (Crystal Originated Particle), FPDs (Flow Pattern Defect), and LSTDs (Laser Scattering Tomography Defects) in accordance with evaluation methods. These defects deteriorate the so-called GOI (Gate Oxide Integrity) property and are known to be in the form of an octahedral void. Otherwise, if the value of V/G is smaller than a threshold value ξ, the interstitial rich region where the interstitial silicons occur as the dominant point defects is formed. In the interstitial rich region, large dislocation particles (LDP) are formed from an agglomerate of interstitial silicons. In addition, in the edge portion of the vacancy rich region, the oxide defect region which is very stabilized even at a high temperature is formed and the associated defects are formed by the interstitial silicons.

The oxide defect region is formed in a shape of ring, and the stacking faults which occur after a wet oxidation process are referred to as the OiSF ring. The OiSF ring region has much stabilized oxygen precipitation, and inside the OiSF ring, there is a region where the oxygen precipitates are ideally increasing.

Although the vacancy rich region is located individually or mixed together with the OiSF ring region in most of the general silicon single crystals, the OiSF ring is completely removed in the central direction of the ingot, so that the so-called defectless crystal where the void defects located in the vacancy rich region are completely removed can be obtained. The defectless crystal stands for a crystal where any void defects are not formed by controlling thermal hysteresis in the growing and cooling processes on the crystal. These crystal regions are classified into a vacancy pure region and an interstitial pure region. The vacancy pure region is a region where any void defects such as COPs are not formed, or infinitesimal-size vacancy-associated defects that are not detectable by the current analytical techniques are formed. The vacancy pure region shows a high degree of the oxygen precipitation. The interstitial pure region is a region where any large dislocation particles (LDP) are not formed and shows a high concentration of the interstitial silicons.

Much research has made to control the void defects and the OiSF ring. In particular, it is believed to preferable that the crystal growing conditions are controlled at the time of growing the single crystal to form the crystal having the only one of the vacancy pure region and the interstitial pure region, thereby completely removing the void crystal defects and the OiSF ring to fabricate an ideal wafer. However, since various factors such as pulling rate are frequently varying at the time of growing the crystal and the structure of the so-called hot zone is complicated, and the grower hardware has a structural limitation, the crystal growing condition controlling approach has much difficulty in ensuring mass production technique and productivity.

Figure 3A:
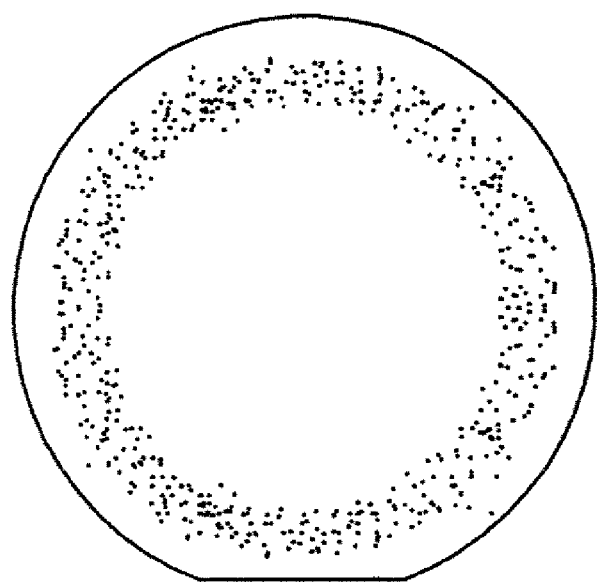
FIGS. 3a and 3b illustrate shapes of an OiSF (Oxidation Induced Stacking Fault) ring and an OiSF disk, respectively.
Figure 3B:
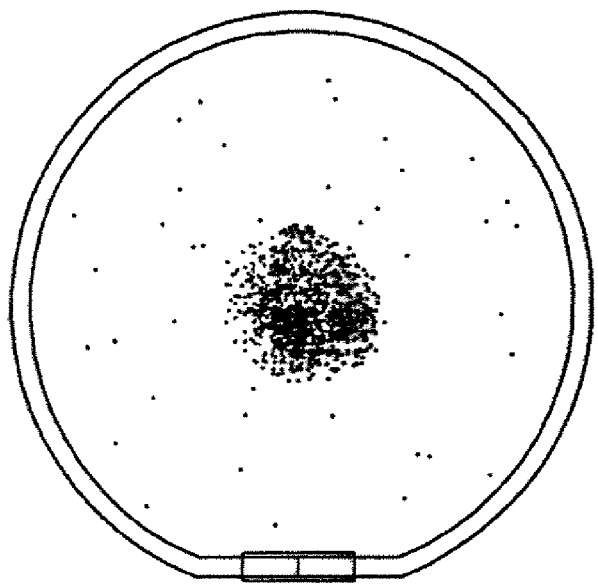

Therefore, an alternative wafer has been fabricated. In the wafer, the OiSF ring is located at the peripheral edge of the wafer (see FIG. 3a), or the OiSF disk is located at the central region of the wafer (see FIG. 3b) at the time of growing the crystal, as shown in FIG. 3, As described above, in the case that the OiSF ring formed at the edge of the wafer (see FIG. 3a) or the OiSF disk formed at the central region of the wafer (see FIG. 3b) are located within the bulk at time of fabricating the devices, they may not have any influence on the electrical properties or the GOI property of the devices. However, in the case that they are located at the surface of the wafer or near the surface of the wafer (within a range of about 3 μm to about 4 μm from the surface of the wafer), they have a bad influence on the electrical properties of the devices. Therefore, in order to avoid such a bad influence, it is important to develop a method of fabricating a wafer having a perfect device zone with size of 5 μm or more.

With respect to a method of detecting defects, in general, after a thermal treatment process is carried out at the temperature of about 800° C. for about 4 hours by using a diffusion furnace and then another thermal treatment process is carried out at the temperature of about 1000° C. for about 16 hours, the OiSF ring trace behavior has been observed. However, since the size of the nuclei formed at the time of growing the crystal are infinitesimal in case of the OiSF ring trace, the general evaluation approaches have difficulty in observing the OiSF ring trace. Therefore, the more accurate evaluation approaches have been needed to observe the OiSF ring trace. In an embodiment, a disclosed method of detecting the wafer defects by using a multiple thermal processing method is introduced to completely observe crystal properties and the associated defect properties. An ideal wafer has to secure a completely perfect device zone on a certain surface region certified by the aforementioned method of detecting defects. Through the method of detecting defects in accordance with the multiple thermal processing method, the defects can be detected in consideration of the growing properties which typically occur in the wafer.

Figure 4:
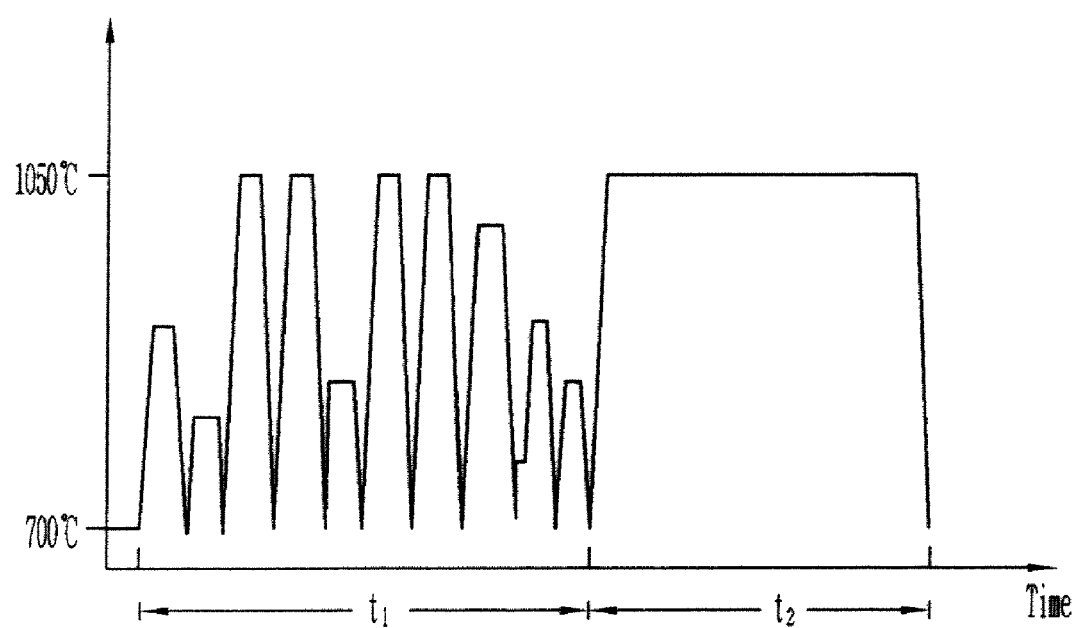
FIG. 4 graphically illustrates a method of detecting defects in accordance with a multiple thermal processing method.
Figure 5A:
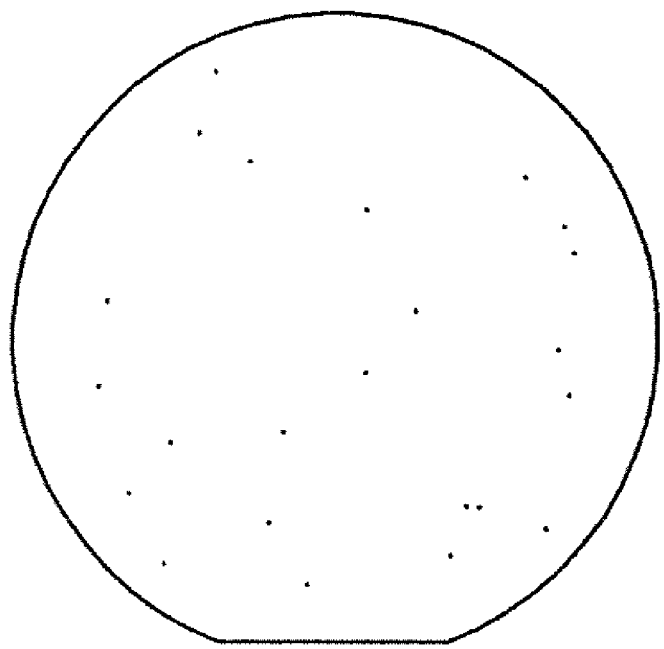
FIGS. 5a and 5b are plan views illustrating results of evaluation of fine surface defects on wafers having OiSF disk trace.
Figure 5B:
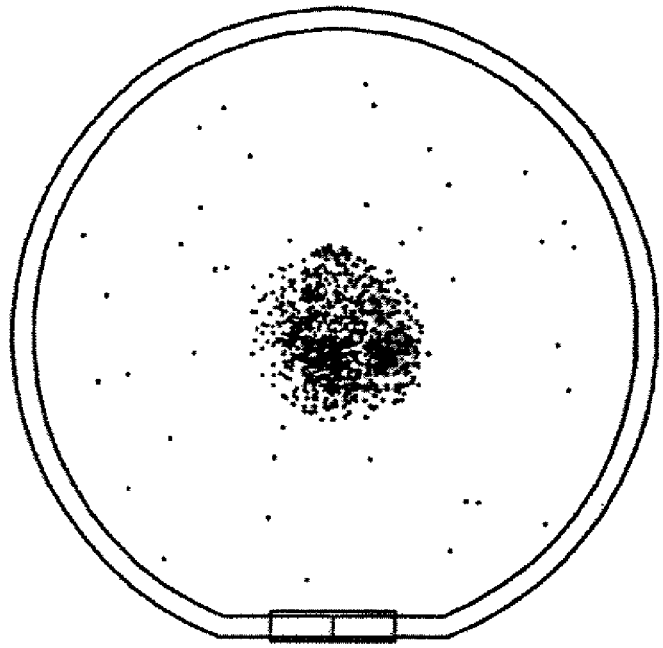

FIG. 4 shows a method of detecting defects in accordance with a multiple thermal processing method. According to the result of the evaluation through a method of detecting defects in accordance with a general thermal treatment process, as shown in FIG. 5a, the OiSF disk appears not to be present. However, according to one of the results of the evaluation through the method of detecting defects in accordance with the multiple thermal processing method, as shown in FIG. 5b, the OiSF disk is observed. A wafer is disclosed having a value of DZ (Denuded Zone) of 5 μm or more and a method of fabricating the wafer when the wafer is evaluated by the method of detecting defects in accordance with the multiple thermal processing method is also disclosed.

FIGS. 5a and 5b are views illustrating results of evaluation of fine surface defects on wafers having OiSF disk traces. Each of the results is obtained by removing a depth of 5 μm in the direction of the bulk from the surface of the wafer having the OiSF disk trace and performing a measurement with a particle counter.

As shown in FIG. 5a, in the result of the evaluation of the wafer fabricated by the conventional method through the method of detecting defects in accordance with a general thermal treatment method, the defects having a form of the OiSF disk never appears to be present. However, in the result of the evaluation of the wafer fabricated by the conventional method through the method of detecting defects in accordance with the multiple thermal processing method, the OiSF disk is discovered to be present on the surface region of the wafer. Accordingly, it can be indirectly understood that the defects are present in the surface region of the wafer (near surface region at the depth of about 3 μm from the surface) in case of the evaluation of the conventional wafer in accordance with the multiple thermal processing method.

Figure 6A:
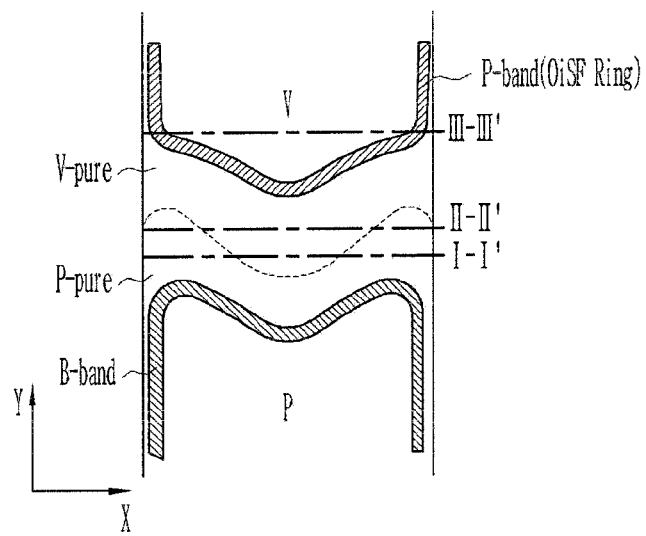
FIGS. 6a and 6b illustrate shapes of an OiSF ring and an OiSF disk located in a void-defectless crystal.
Figure 6B:
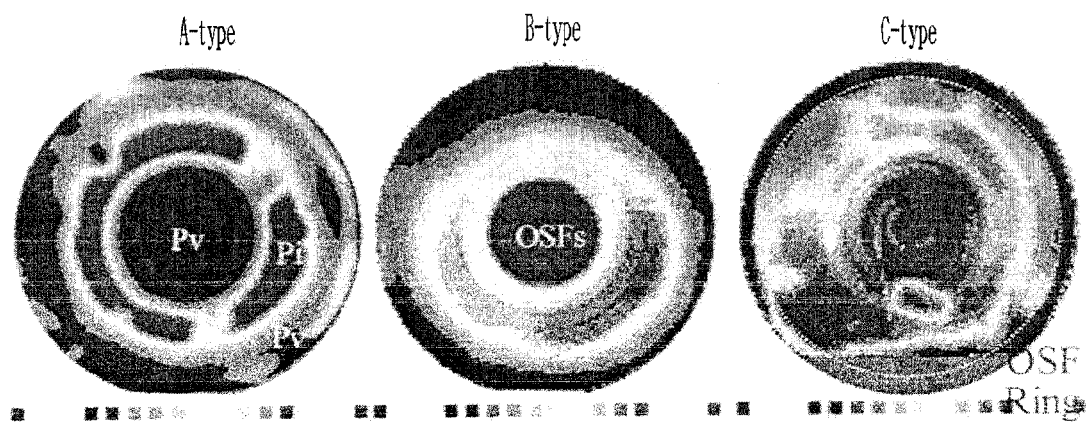

FIGS. 6a and 6b are views for explaining shapes of an OiSF ring and an OiSF disk located in a void-defectless crystal. The figures show the shapes of the OiSFs which are generally distributed within the crystal while the void-defectless crystal is being grown. In the case that the OiSFs are located in the silicon wafer, the OiSFs are distributed in the shape of a ring or a disk. FIG. 6a shows results of the measurements which the ingot is sliced in the central axial direction, that is, the growing direction of the silicon single crystal. Herein, X-axis indicates the line from an edge point to the counterpart edge point of the ingot, and Y-axis indicates the growing direction of the silicon single crystal. FIG. 6b shows the shapes of the OiSFs of the silicon wafer which is sliced in perpendicular to the growing direction (the central axial direction). The A-type of the shapes is an OiSF disk shown on the cross-section of the silicon wafer which is sliced at the line I-I' in FIG. 6a. The B-type of the shapes is an OiSF disk shown on the cross-section of the silicon wafer which is sliced at the line II-II' in FIG. 6a. The C-type of the shapes is an OiSF ring shown on the cross-section of the silicon wafer which is sliced at the line III-III' in FIG. 6a.

Figure 7:
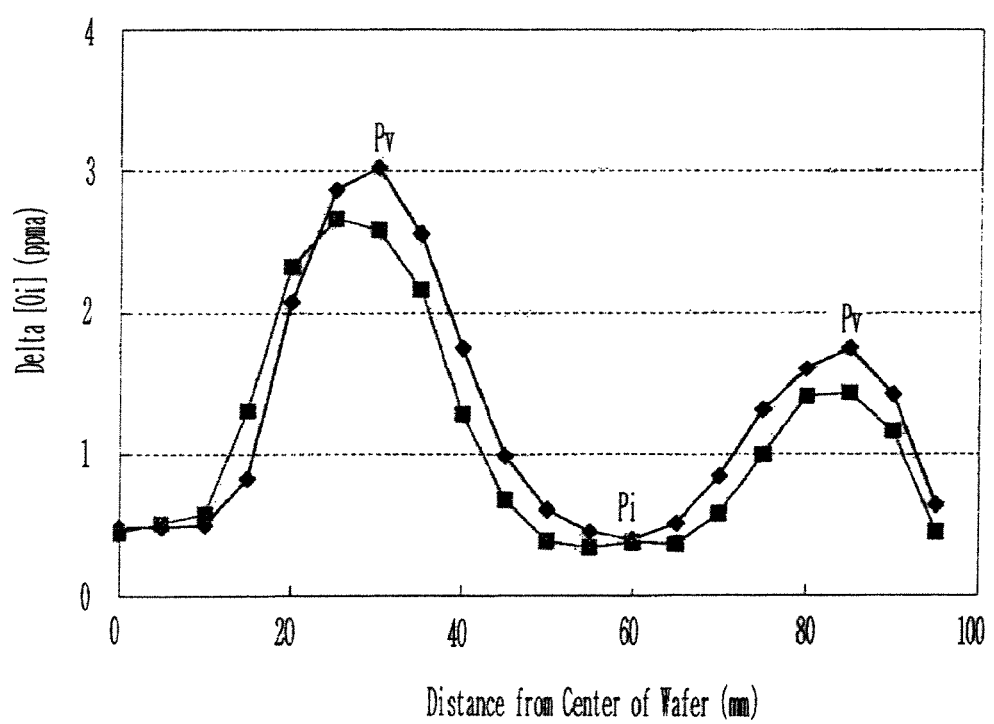
FIG. 7 graphically illustrates a property of non-uniformity in an oxygen precipitation behavior.

In the void-defectless silicon single crystal grown by the CZ method, the defects associated with the oxygen precipitation are mainly contained. The COPs are not contained, and the different point defects are contained in different regions. The region where the vacancies are dominant is indicated as a Pv region, and the region where the interstitials are dominant is indicated as a Pi region. The Pv and Pi regions have their own coverage areas determined in accordance with the thermal hysteresis in the crystal growing process and show their own non-uniform properties in the oxygen precipitation behavior as shown in FIG. 7. The point defects located in the Pv and Pi regions with respect to the oxygen precipitation, particularly, the vacancies may function as nuclei which are able to be grown into fine oxygen precipitates in the device active layer during the thermal treatment process in the device thermal simulation cycle. In case of the presence of such oxygen precipitates on the surface or near the surface of the wafer, the oxygen precipitates has a bad influence on the electrical properties of the devices to increase the leakage currents at the PN junction. In turn, as the devices are getting highly integrated and the design rule is getting further reduced, such influence on the electrical properties of the devices may be still larger.

The method of controlling the void defects and the internal defects such as oxygen precipitates includes a controlling method at the time of growing the single crystal and a controlling method using a thermal treatment process after growing the single crystal. The thermal treatment process includes a process using a diffusion furnace and a rapid thermal process using a halogen lamp. In case of the process using the diffusion furnace, a thermal treatment process is performed in $H_2$ or Ar gas ambient at a high temperature of 1200° C. or more for one hour or more, and then, a device perfect zone is formed on some of the surface region of the wafer by the out-diffusion of the oxygen and the rearrangement of the silicon. However, as the diameter of the wafer is getting larger and larger, the conventional method has large difficulty in controlling slip dislocations which are formed on the wafer due to a high-temperature thermal treatment process and controlling contaminants which are formed due to the high-temperature thermal treatment process. On the other hand, in case of evaluating the silicon wafer fabricated by using the conventional RTP process in accordance with the method of detecting defects by using the multiple thermal processing method, only the fine oxygen precipitates within 3 μm to 4 μm from the surface can be controlled, so that it is impossible to completely control the OiSF ring. Therefore, the present invention provides a two-step rapid thermal processing method which is distinguished from the conventional method. In the two-step rapid thermal processing method, the void defects and the fine oxygen precipitates located in the device active region are completely removed to secure the perfect device zone, and bulk stacking faults having a certain level or more are formed in the bulk region of the wafer to intensify the gettering property.

Figure 8:
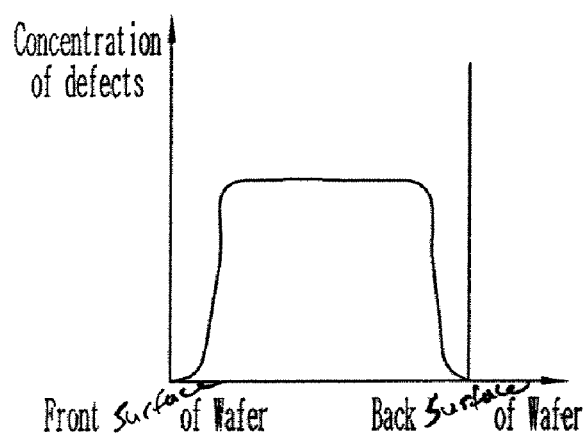
FIG. 8 graphically illustrates a concentration profile of bulk stacking faults of a silicon wafer according to a disclosed embodiment.

FIG. 8 is a view schematically illustrating a concentration profile of bulk stacking faults of a silicon wafer according to the preferred embodiment. With respect to the silicon wafer fabricated according to the preferred embodiment, in the surface regions within the certain depths from the front and back surfaces of the wafer, there are few bulk stacking faults, and in the bulk region, the bulk stacking faults are present enough to perform the function for gettering are distributed constantly over the entire bulk region. The bulk stacking faults located sufficiently and constantly in the bulk regions perform the function for gettering metal impurities sufficiently. Therefore, by gettering the metallic contaminating substances which are out-diffused in the subsequent thermal treatment process, etc., due to the bulk stacking faults located sufficiently and constantly in the entire bulk region, it is possible to remarkably reduce the amount of the metallic contaminating substances which are out-diffused toward the surface.

More specifically, referring to FIG. 8, a first denuded zone in which any bulk stacking fault does not exit is formed within a certain depth of, for example, about 5 μm to about 40 μm from the front surface of the wafer, and a second denuded zone in which any bulk stacking fault does not exit is formed within a certain depth of, for example, about 5 μm to about 40 μm from the back surface of the wafer. In the bulk region between the first and second denuded zones, the concentration profile is constant almost without its variation and has a horizontal gradient. As the concentration profile of the defects of the wafer is entirely viewed, the concentration profile of the defects between the front and back surfaces of the wafer has a stepwise shape having an axial symmetry at the center between the front and back surfaces of the wafer. On the other hand, the bulk region has vertically-rising concentration gradients at boundaries of the first and second denuded zones, and the bulk region has a horizontal concentration gradient with a small variation (for example, having a planar shape within a range of variation of 10%) over the entire bulk region. In case of the defects being the bulk stacking faults, the concentration of the bulk stacking faults in the bulk region has a distribution which is maintained constant in a range of $1.0 \times 10^8$ ea/cm$^3$ to $3.0 \times 10^9$ ea/cm$^3$. In case of the defects being BMDs (Bulk Micro-Defect) including the oxygen precipitates and the bulk stacking faults, the concentration of the BMDs in the bulk region has a distribution which is maintained constant in a range of $3.0 \times 10^8$ ea/cm$^3$ to $1.0 \times 10^{10}$ ea/cm$^3$. The detailed description thereof will be made later.

Figure 9:
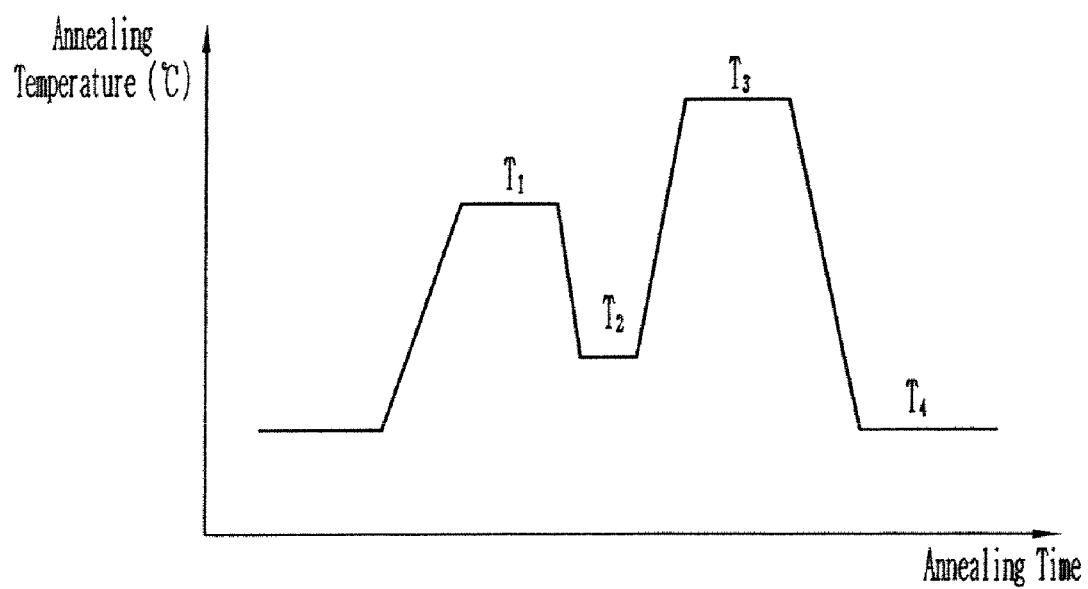
FIG. 9 graphically illustrates a two-step rapid thermal processing (RTP) process according to a preferred embodiment.

FIG. 9 is a view for explaining a two-step rapid thermal processing (RTP) process according to a preferred embodiment of the present invention. A generally commercialized RTP apparatus (furnace) is employed.

Referring to FIG. 9, firstly, a silicon wafer which is prepared by slicing an ingot grown by the CZ method is loaded on the RTP apparatus. At that time, the temperature of the RTP apparatus is preferably set to about 700° C. Subsequently, the internal temperature of the RTP apparatus is rapidly raised up to a first temperature of, for example, from about 1120° C. to about 1180° C. at a predetermined first temperature ramp-up rate, for example, about 50° C./sec. After the time that the internal temperature of the RTP apparatus is raised up to the first temperature of target, the first temperature is maintained for a time period of, for example, 1 second to 5 seconds. Next, the internal temperature of the RTP apparatus is rapidly dropped down to a second temperature of, for example, about 800° C. at a predetermined first temperature ramp-down rate, for example, about 70° C./sec. At that time, the second temperature is preferably equal to or higher than a temperature which is set at the time of the loading process. By doing the aforementioned processes, the first rapid thermal process is completed. It is preferable that an inert gas such as Ar gas is continuously flowed during the first rapid thermal process, ammonia (NH3) gas is supplied, for the time period of maintaining the first temperature, and the ammonia gas is blocked, for the time period of dropping the internal temperature down to the second temperature.

Subsequently, after the second temperature is maintained for a predetermined time period, the internal temperature of the RTP apparatus is rapidly raised up to a third temperature of, for example, from about 1200° C. to about 1230° C. at a predetermined second temperature ramp-up rate, for example, about 50° C./sec. After the time that the internal temperature of the RTP apparatus is raised up to the third temperature of target, the third temperature is maintained for a time period of, for example, from about 1 second to about 10 seconds. The third temperature is higher than the first temperature. Next, the internal temperature of the RTP apparatus is rapidly dropped down to a fourth temperature of, for example, about 700° C. at a predetermined second temperature ramp-down rate, for example, about 50° C./sec. The fourth temperature is preferably equal to a temperature which is set at the time of the loading process. In addition, the second temperature ramp-down rate is lower than the first ramp-down rate in the first rapid thermal process. By doing the aforementioned processes, the second rapid thermal process is completed. It is preferable that an inert gas such as Ar gas is continuously flowed during the second rapid thermal process. In the concentration profile of the bulk stacking faults of the silicon wafer according to the embodiment described with reference to FIG. 9, in the surface regions within the certain depths from the front and back edges of the wafer, there are few bulk staking faults, and in the bulk region, the bulk stacking faults enough to perform the function for gettering are distributed constantly over the entire bulk region. In general, the nuclei of the bulk stacking faults have non-uniform sizes which range from order of 1 nm to order of 100 nm. The nuclei having a larger size than a threshold size are grown to form the bulk stacking faults through the disclosed two-step rapid thermal process.

The concentration profile of the defects of the silicon wafer described with reference to FIG. 8 can be obtained by using the aforementioned two-step rapid thermal process. The concentration profiles will vary depending upon the particular RTP apparatuses, the temperatures of the thermal treatment processes, the time periods of the thermal treatment processes, the temperature ramp-up rate, the temperature ramp-down rate, the types of the ambient gas, the flow rate, the mixture ratio, and so on.

Figure 10:
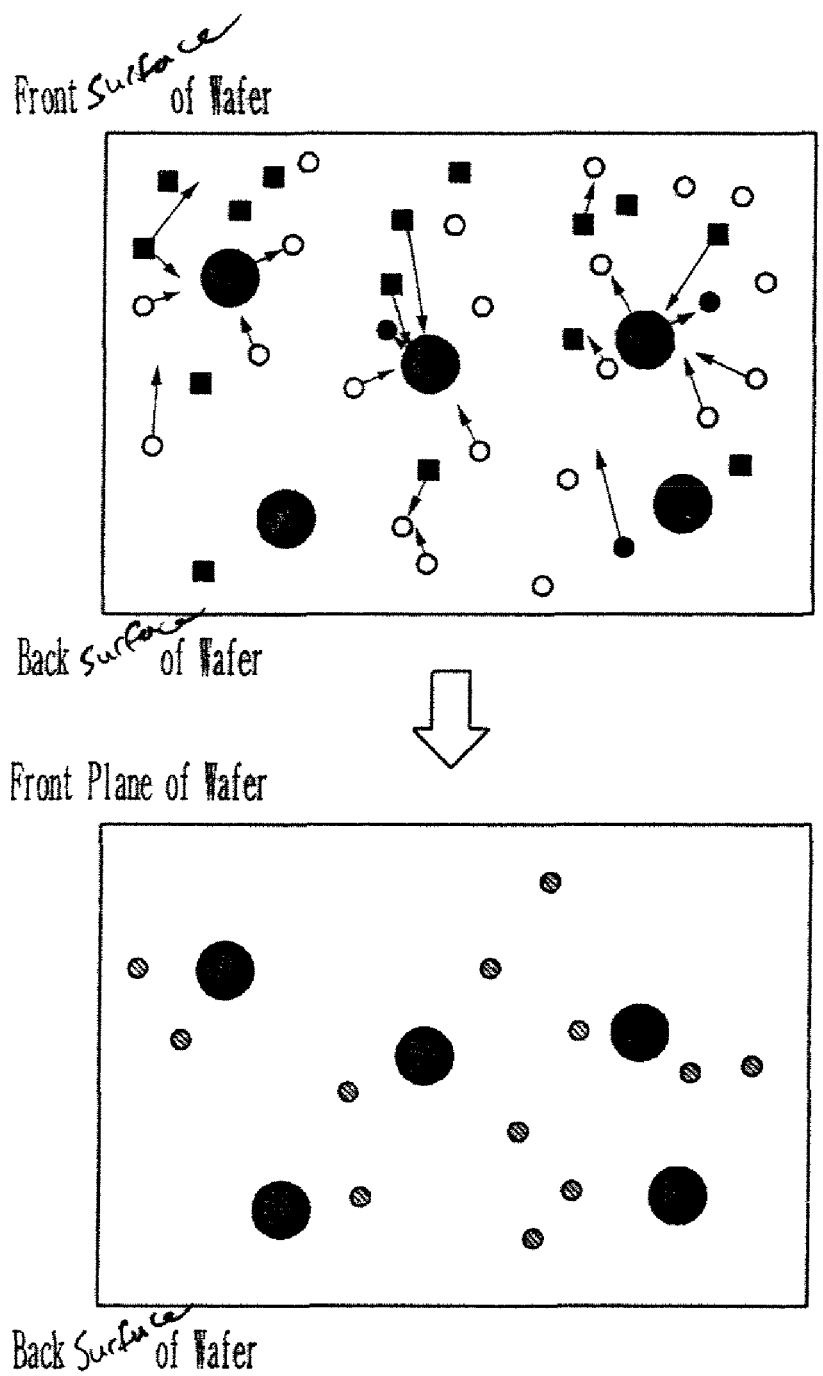
FIG. 10 illustrates a disclosed method of controlling point defects by means of a modeling according to a disclosed embodiment.

FIG. 10 is a view for explaining a method of controlling point defects by means of a modeling according to an embodiment of the present invention. In FIGS. 10, (a), (b), (c), (d), and (e) indicates the vacancies, the interstitial silicons, the interstitial oxygen, the oxygen precipitates, and the bulk stacking faults, respectively.

Referring to FIG. 10, in the first rapid thermal process, the vacancies are consumed to accelerate the formation of the nuclei of the fine oxygen precipitates, and in the second rapid thermal process, the nuclei of the fine oxygen precipitates located in a region near the surface of the silicon wafer are removed to further accelerate the growth of the nuclei of the oxygen precipitates located in the internal bulk region of the silicon wafer. By doing so, the bulk stacking faults are provided for manufacturing the semiconductor devices, so that it is possible to improve the gettering efficiency of the manufacturing processes.

Figure 11:
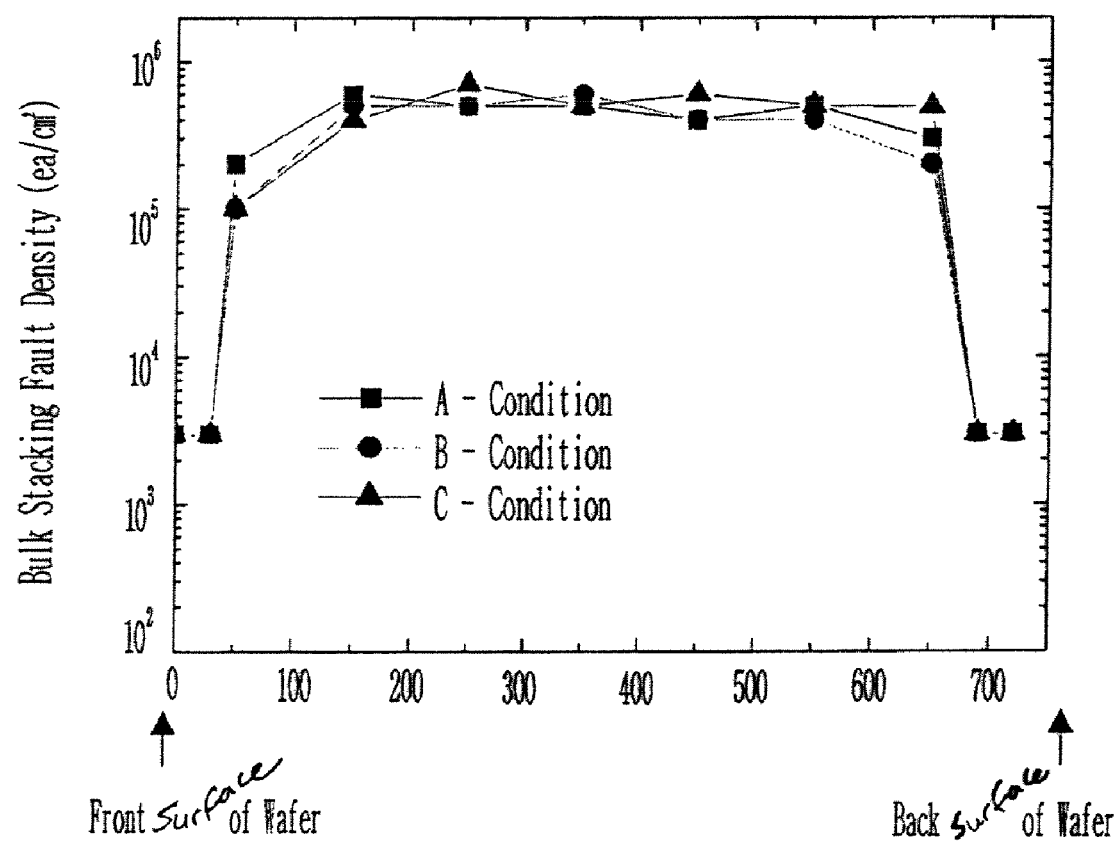
FIG. 11 graphically illustrates a density of bulk stacking faults in a silicon wafer which is fabricated according to a disclosed embodiment.

FIG. 11 graphically illustrates a bulk stacking fault density in a silicon wafer which is fabricated according to a disclosed embodiment. The photograph is a result which is obtained by performing the two-step rapid thermal process, performing a wet etching for 3 minutes with a solution having a predetermined mixture ratio of $NH_3$, $H_2O_2$, and $H_2O$, and then, measuring the bulk stacking faults with an optical microscope.

Referring to FIG. 11, condition A comprises a first thermal processing step for maintaining a first temperature of 1170° C. for 5 seconds and a second thermal processing step for maintaining a third temperature of 1230° C. for 10 seconds.

Condition B comprises a first thermal processing step for maintaining a first temperature of 1150° C. for 5 seconds and a second thermal processing step for maintaining a third temperature of 1215° C. for 10 seconds.

Condition C comprises a first thermal processing step for maintaining a first temperature of 1130° C. for 5 seconds and a second thermal processing step for maintaining a third temperature of 1200° C. for 10 seconds.

Commonly in all conditions A, B, and C, the first temperature ramp-up rate is set to 50° C./sec, the first temperature ramp-down rate is set to 70° C./sec, the second temperature ramp-up rate is set to 50° C./sec, and the second temperature ramp-down rate is set to 50° C./sec, thereby the temperature be dropped down to the fourth temperature of 700° C. In addition, commonly in all the conditions A, B, and C, Ar gas is used for the first and second thermal processing steps, and for the time period of maintaining the first temperature, ammonia (NH3) gas is supplied. At that time, for the time period of maintaining the first temperature, the Ar gas is supplied at the flow rate of 3.75 slm, the ammonia ($NH_3$) gas is supplied at the flow rate of 0.25 slm. In addition, whereas the Ar gas and the ammonia ($NH_3$) gas are supplied for the time period of maintaining the first temperature, only the Ar gas is supplied for the time period of maintaining the temperature except for the first temperature in both of the first and second thermal processing steps. At that time, the Ar gas is supplied at the flow rate of 4 slm.

As shown in FIG. 11, with respect to the density of the bulk stacking faults, in the surface regions within the certain depths from the front and back surfaces of the wafer, there are few bulk staking faults, and in the bulk region, the bulk stacking faults enough to perform the function for gettering are distributed constantly over the entire bulk region. The bulk stacking faults located sufficiently and constantly in the bulk regions perform the function for gettering metal impurities sufficiently. Therefore, by gettering the metallic contaminating substances which are out-diffused in the subsequent thermal treatment processes, etc., due to the bulk stacking faults located sufficiently and constantly in the entire bulk region, it is possible to remarkably reduce the amount of the metallic contaminating substances which are out-diffused toward the surface. The density of the bulk stacking faults in the bulk region has a value of about $5.0 \times 10^4$ to $1.0 \times 10^6$ ea/$cm^2$ which is corresponding to the concentration of $1.0 \times 10^8$ to $3.0 \times 10^9$ ea/$cm^3$.

Figure 12A:
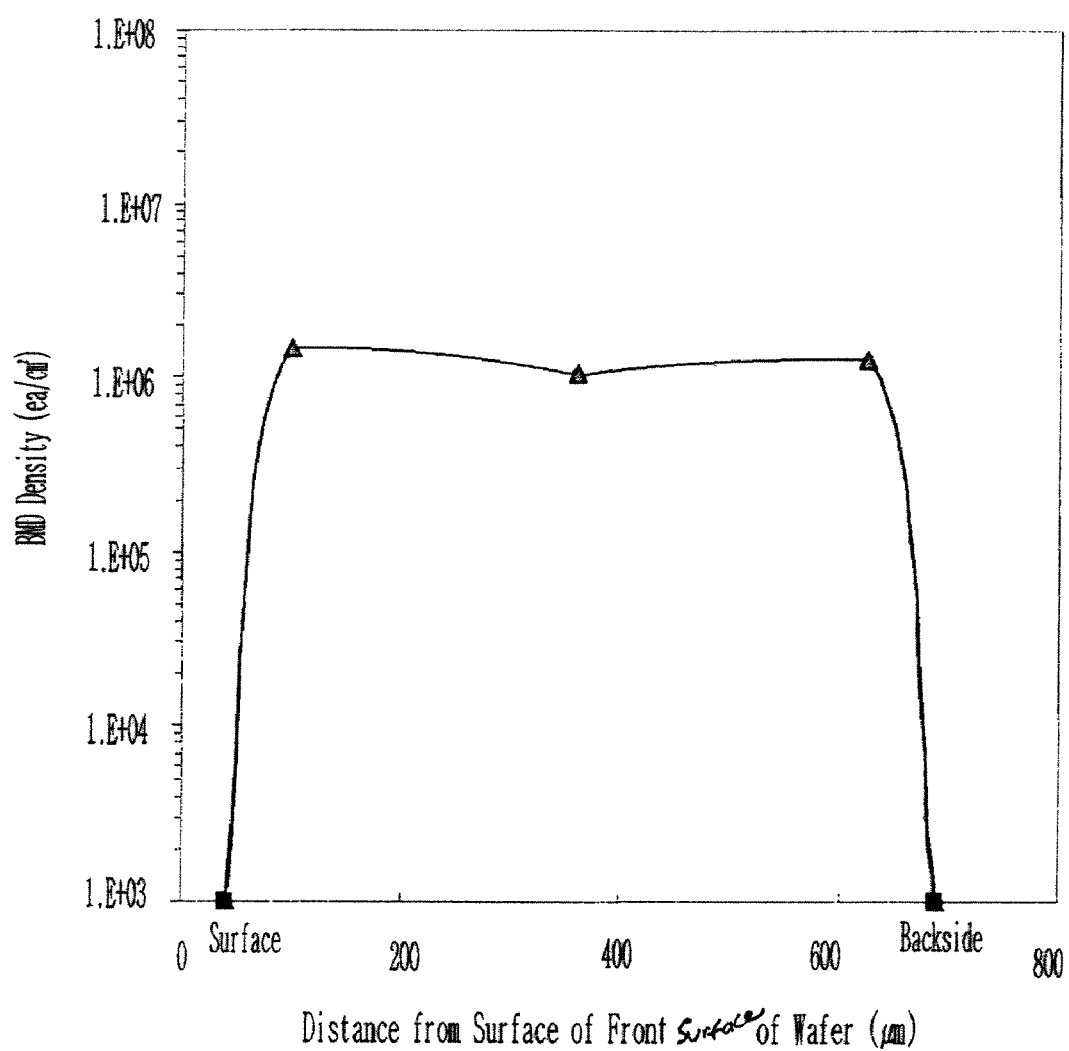
FIGS. 12a and 12b graphically illustrates the density of BMDs (Bulk Micro-Defect) and distance from front surfaces of wafers.
Figure 12B:
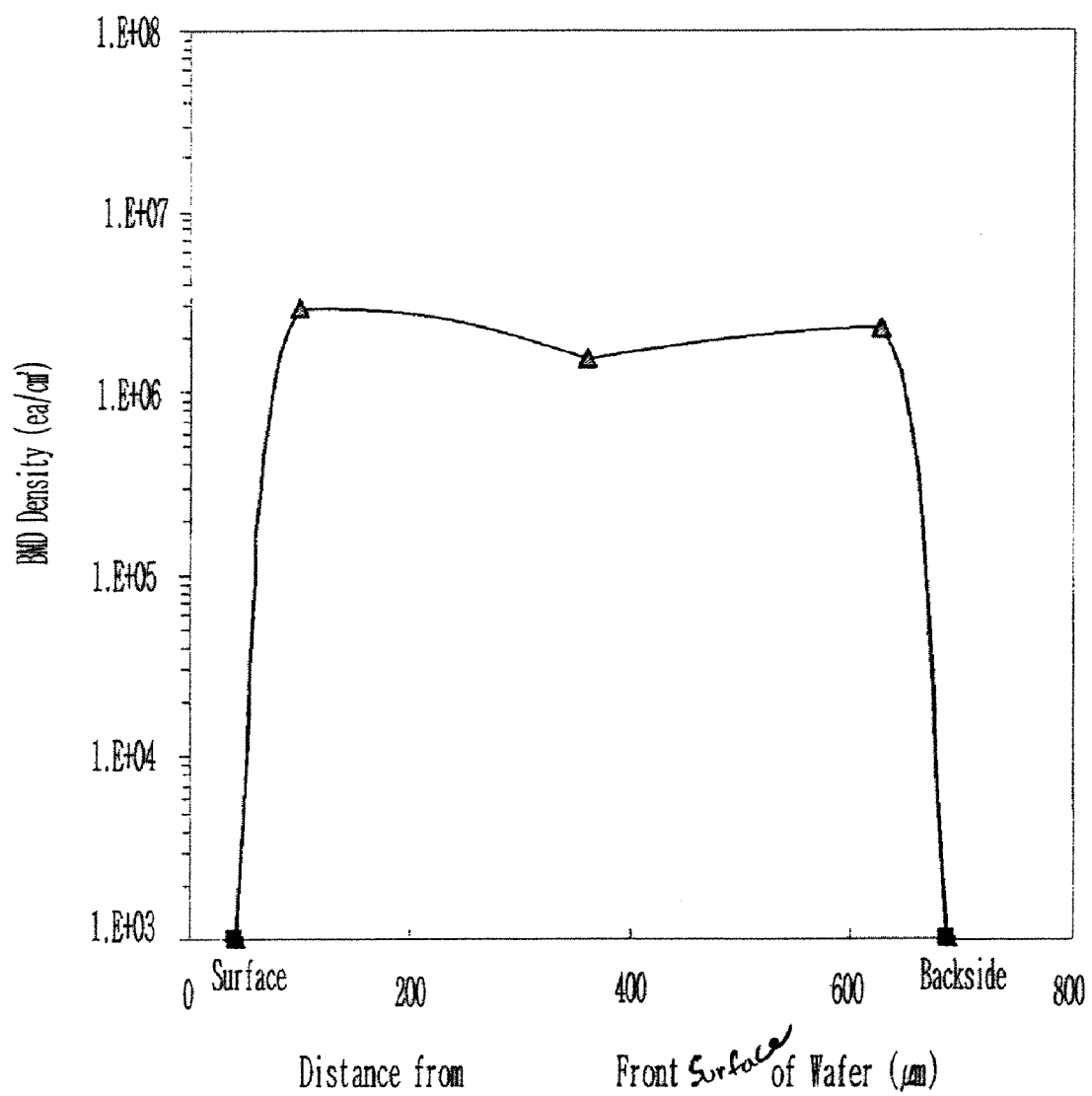

FIGS. 12a and 12b are graphs illustrating a density of BMDs (Bulk Micro-Defect) depending on distances from front surfaces of wafers. In the later description, the same conditions of the rapid thermal processes as those of the rapid thermal processes described with reference to FIG. 9 are not described. Herein, the BMDs stand for defects including the oxygen precipitates and the bulk stacking faults. FIG. 12a is corresponding to the case of performing a two-step rapid thermal process comprising a first rapid thermal processing step of maintaining a first temperature of about 1150° C. for about 10 seconds and a second rapid thermal processing step of maintaining a third temperature of about 1215° C. for about one second in accordance with the embodiment of the present invention, and FIG. 12b is corresponding to the case of performing a two-step rapid thermal process comprising a first rapid thermal processing step of maintaining a first temperature of about 1150° C. for about 10 seconds and a second rapid thermal processing step of maintaining a third temperature of about 1215° C. for about 10 seconds.

As shown in FIGS. 12a and 12b, it can be understood that in the cases of performing the two-step rapid thermal process comprising the first and second rapid thermal processing steps, the density of the BMDs is distributed constantly in the bulk region. The density of the BMDs in the bulk region has a value of about $1.0 \times 10^5$ to about $5.0 \times 10^6$ ea/cm$^2$ which is corresponding to the concentration of $3.0 \times 10^8$ to $1.0 \times 10^{10}$ ea/cm$^3$.

Figure 13:
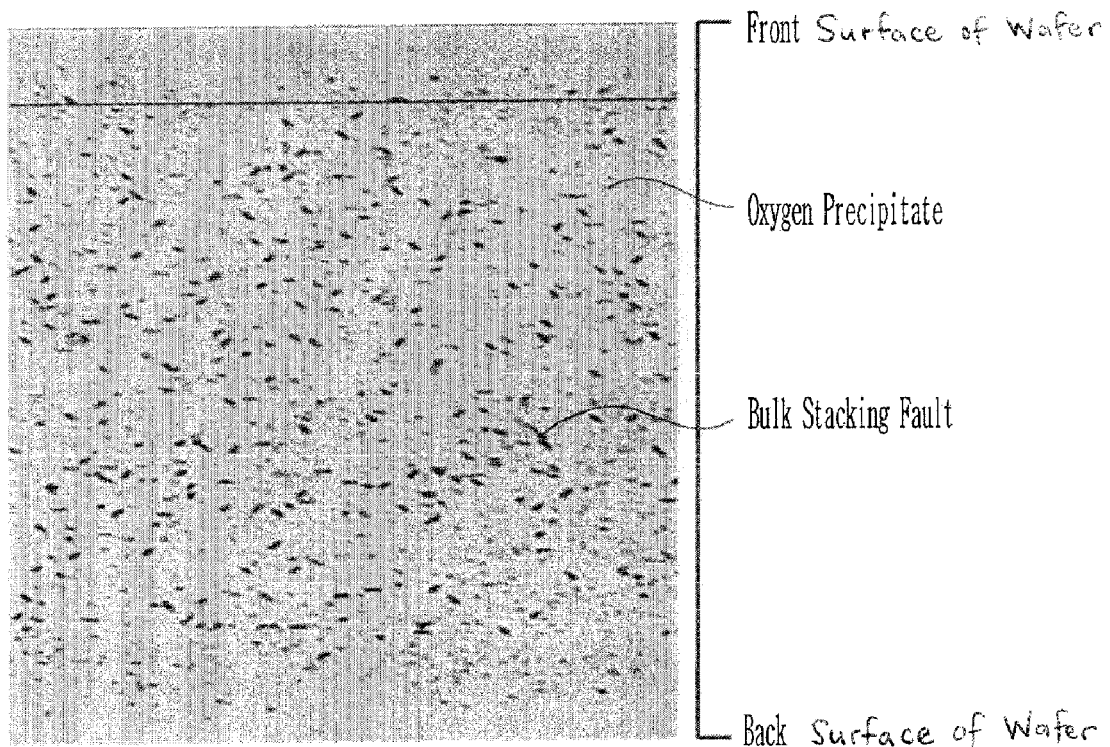
FIG. 13 is a photograph using an optical microscope which illustrates BMDs (Bulk Micro-Defect) in a silicon wafer which is fabricated according to a disclosed embodiment.

FIG. 13 is a photograph of an optical microscope illustrating the BMDs (Bulk Micro-Defect) in a silicon wafer which is fabricated according to another embodiment. Herein, the BMDs stand for defects including the oxygen precipitates (vague and small portions shown in FIG. 13) and the bulk stacking (dark and large portions shown in FIG. 3). FIG. 13 is a photograph of the case that the two-step rapid thermal process is performed under the condition B which described with reference to FIG. 12.

As shown in FIG. 13, it can be understood that a defectless layer having few BMDs is formed in the surface regions of the front and back surfaces of the wafer, and the density of BMDs is almost constant in the bulk region.

Figure 14A:
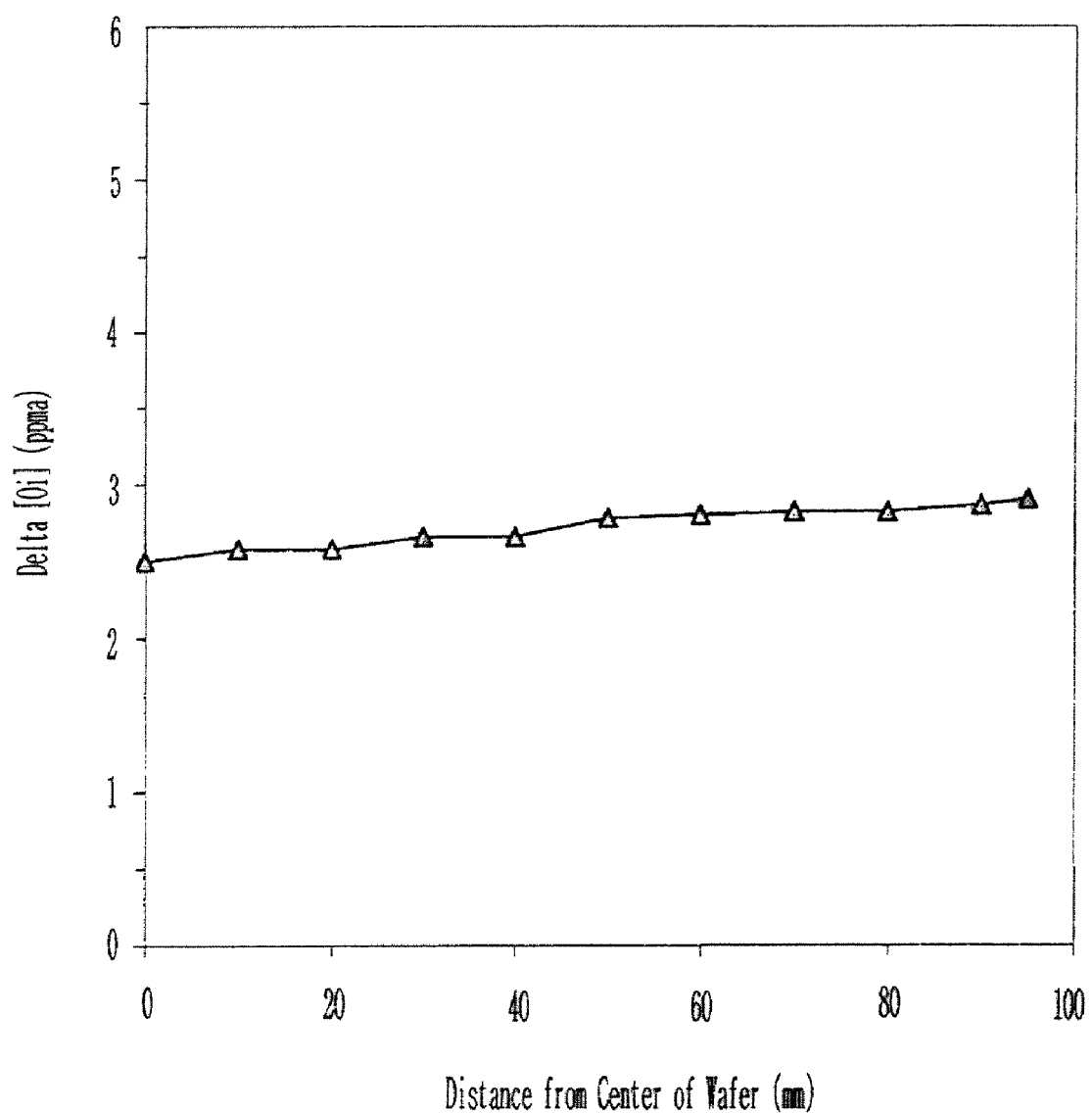
FIGS. 14a and 14b graphically illustrates the relationship between Deltas [Oi] and distance from the center of a wafer.
Figure 14B:
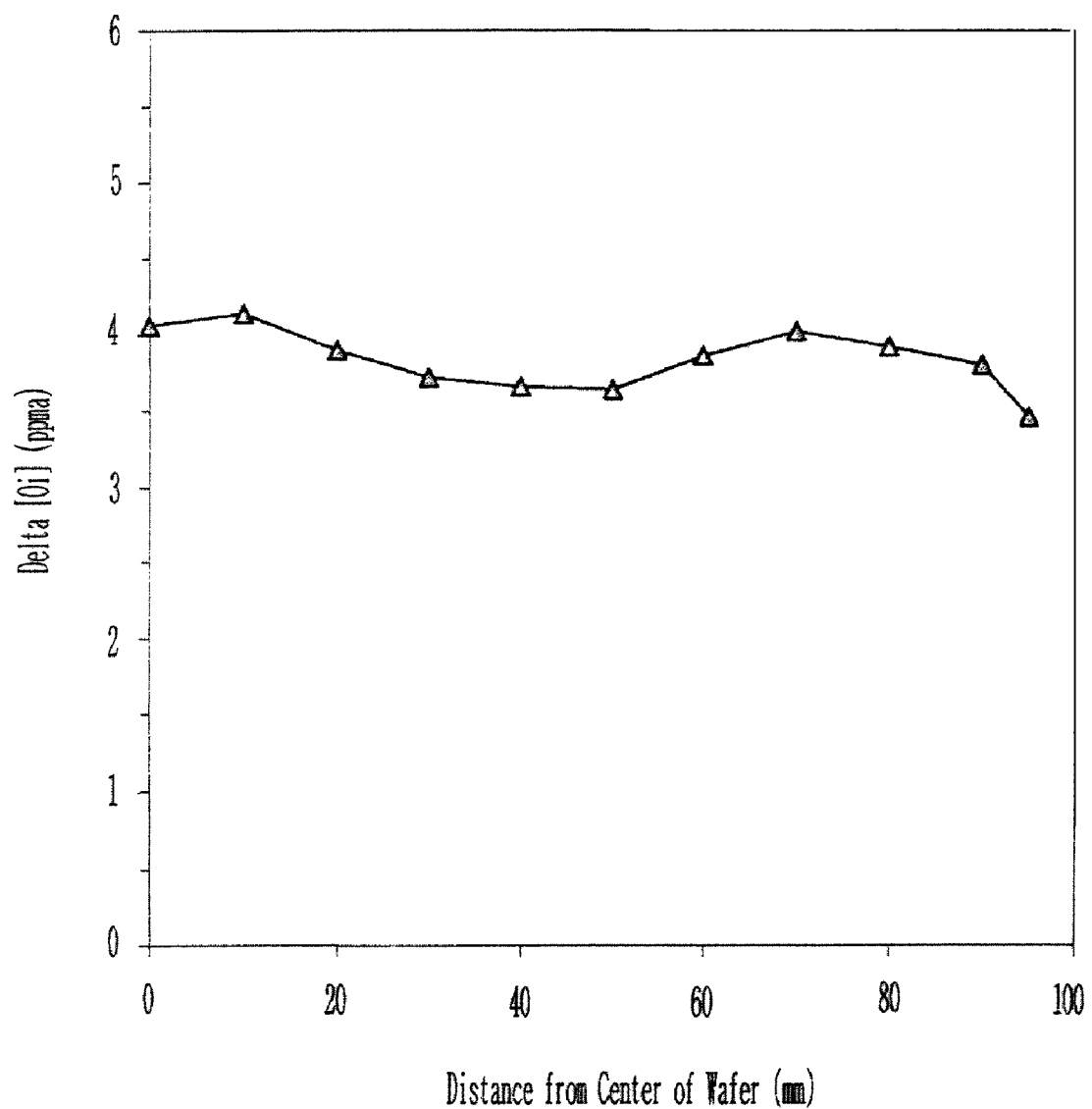

FIGS. 14a and 14b are graphs illustrating Deltas [Oi] depending on distances from centers of wafers. Herein, the phrase, "a distance from a center of a wafer" stands for a distance in the direction toward the edge portion from the center of the wafer, and the term, "Delta [Oi]" stands for a value obtained by subtracting the concentration of oxygen precipitates which are subjected to the thermal treatment process from the initial concentration of oxygen. FIGS. 14a and 14b show the Deltas [Oi], which are corresponding to values measured in the direction toward the edge portion from the center of the wafer from the front surface to the back surfaces of the wafer. In the later description with reference to FIGS. 14a and 14b, the same conditions of the rapid thermal processes as those of the rapid thermal processes described with reference to FIG. 9 are not described. FIG. 14a is corresponding to the case of performing a two-step rapid thermal process comprising a first rapid thermal processing step of maintaining a first temperature of about 1150° C. for about 10 seconds and a second rapid thermal processing step of maintaining a third temperature of about 1215° C. for about one second, and FIG. 14b is corresponding to the case of performing a two-step rapid thermal process comprising a first rapid thermal processing step of maintaining a first temperature of about 1150° C. for about 10 seconds and a second rapid thermal processing step of maintaining a third temperature of about 1215° C. for about 10 seconds.

As shown in FIGS. 14a and 14b, it can be understood that in the cases of performing the two-step rapid thermal process comprising the first and second rapid thermal processing steps, the Deltas [Oi] occur constantly.

Figure 15A:
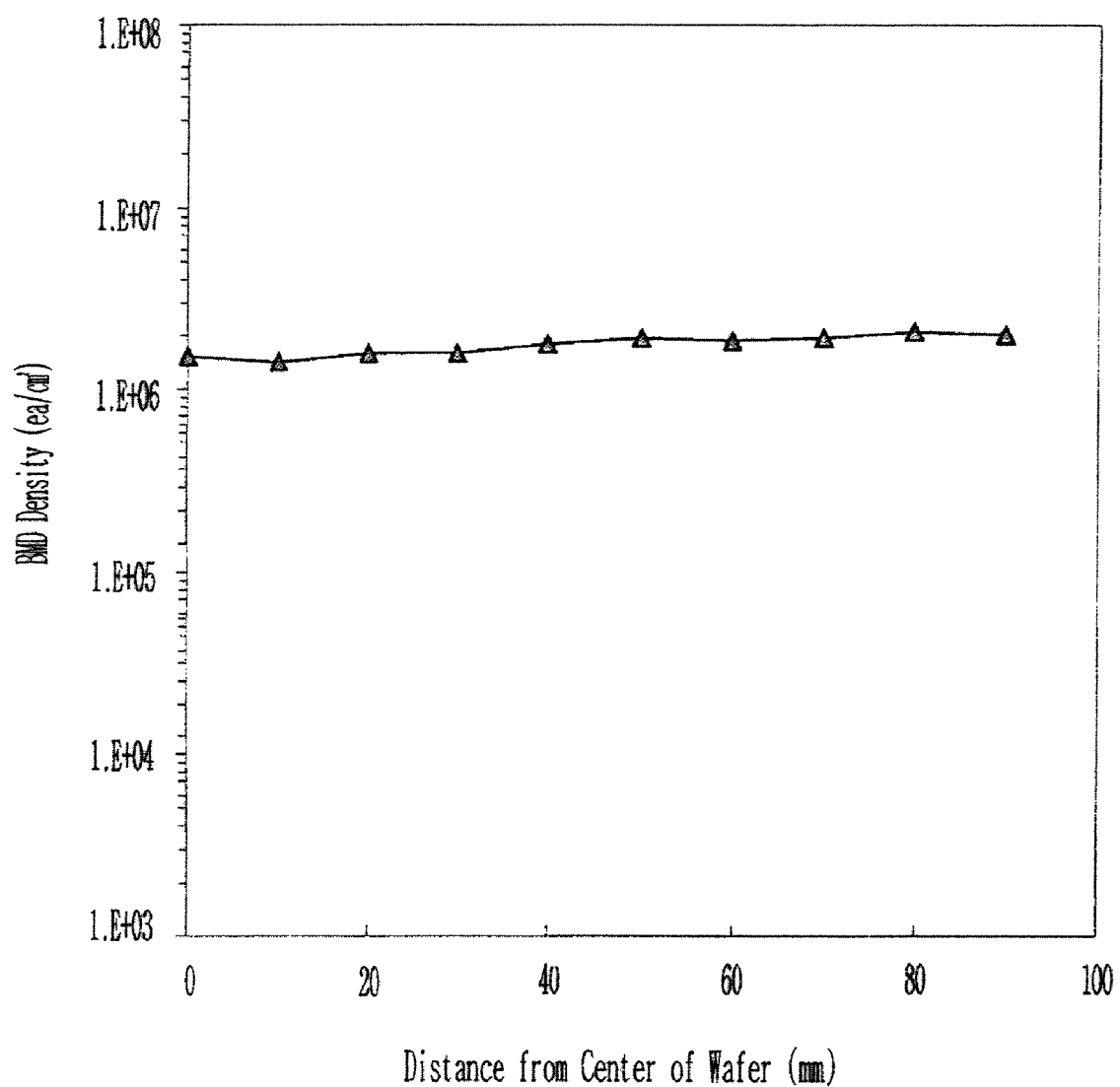
FIGS. 15a and 15b graphically illustrates the relationship between density of BMDs (Bulk Micro-Defect) and distance from the center of a wafers.
Figure 15B:
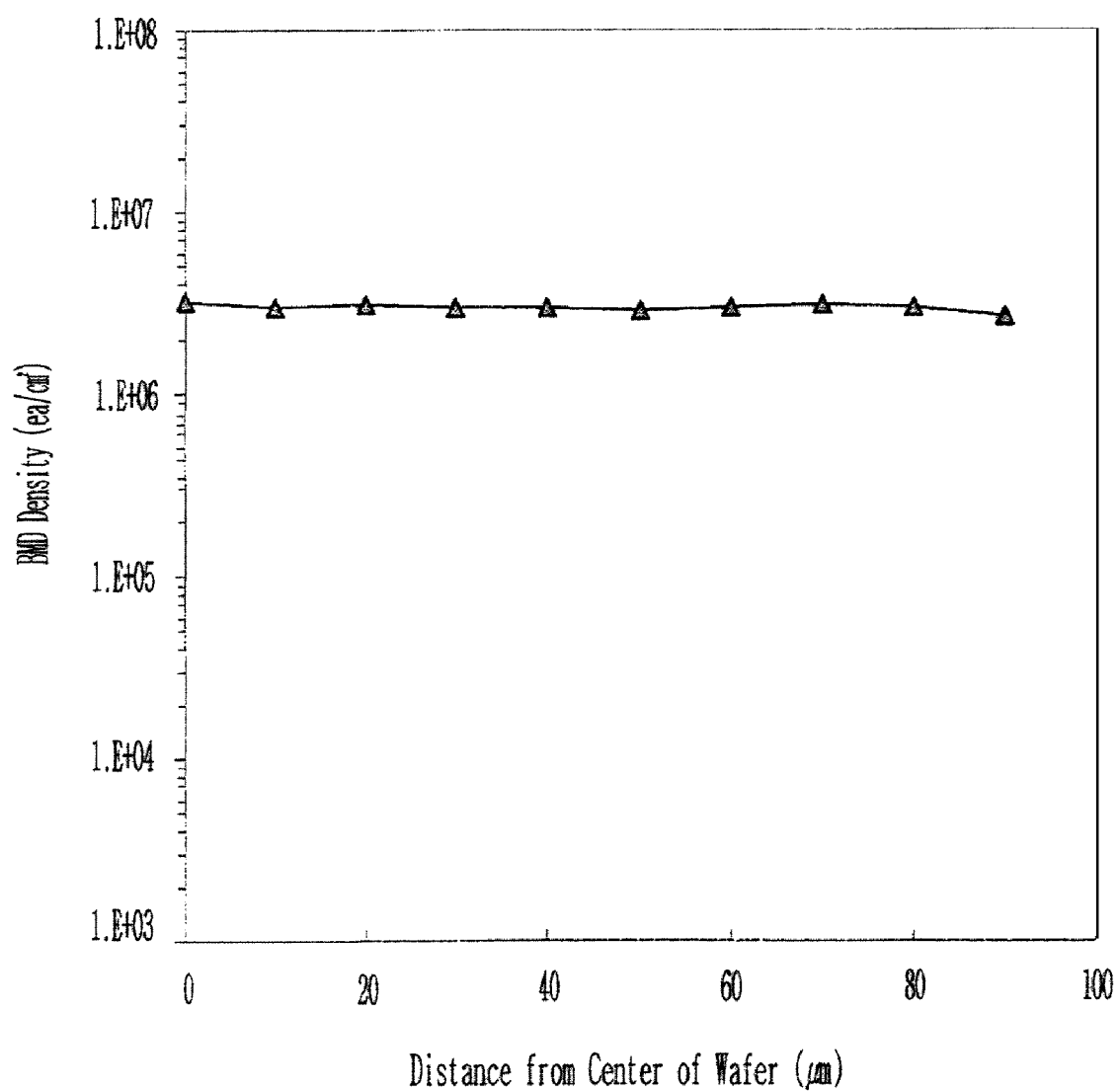

FIGS. 15a and 15b are graphs illustrating a density of BMDs (Bulk Micro-Defect) depending on distance from centers of wafers. FIG. 15a is corresponding to the case of performing a two-step rapid thermal process comprising a first rapid thermal processing step of maintaining a first temperature of about 1150° C. for about 10 seconds and a second rapid thermal processing step of maintaining a third temperature of about 1215° C. for about one second, and FIG. 15b is corresponding to the case of performing a two-step rapid thermal process comprising a first rapid thermal processing step of maintaining a first temperature of about 1150° C. for about 10 seconds and a second rapid thermal processing step of maintaining a third temperature of about 1215° C. for about 10 seconds.

As shown in FIGS. 15a and 15b, it can be understood that in the cases of performing the two-step rapid thermal process comprising the first and second rapid thermal processing steps, the density of the BMDs occurs constantly.

Figure 16A:
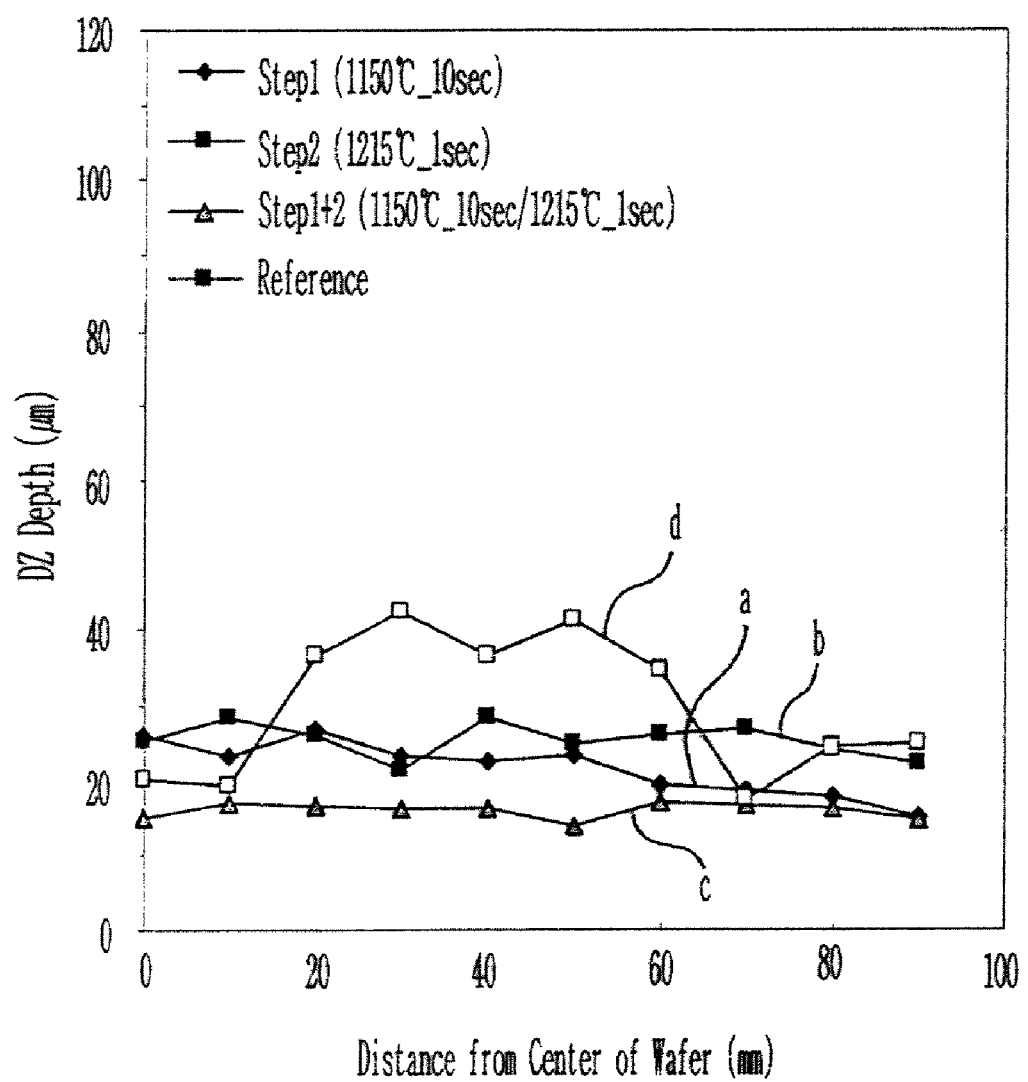
FIGS. 16a and 16b graphically illustrates the relationship between depth of denuded zones (DZ) and distance from the center of a wafers.
Figure 16B:
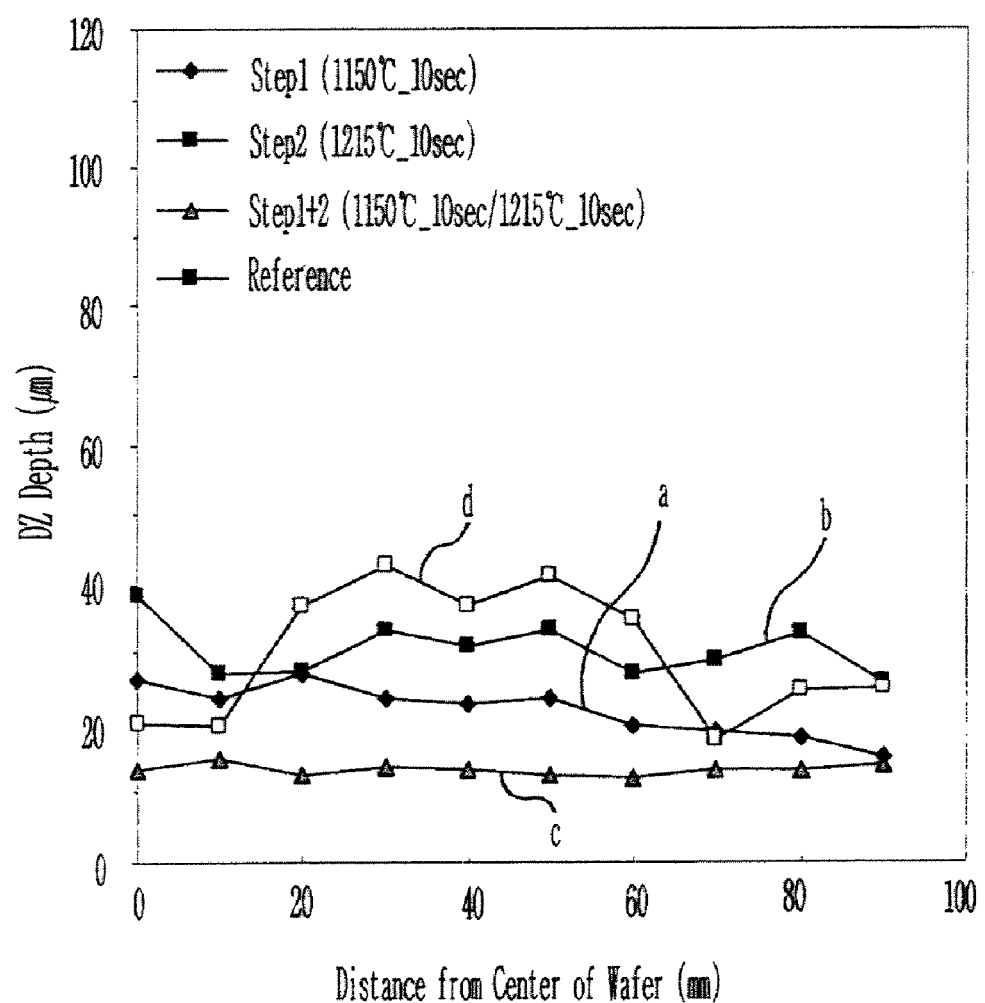

FIGS. 16a and 16b are graphs illustrating depths of denuded zones (DZ) depending on distance from centers of wafers.

In FIG. 16a, (a) corresponds to the case of performing only the first rapid thermal processing step of maintaining a first temperature of about 1150° C. for about 10 seconds, (b) corresponds to the case of performing only the second rapid thermal processing step of maintaining a third temperature of about 1215° C. for about one second, (c) corresponds to the case of a two-step rapid thermal process comprising a first rapid thermal processing step of maintaining a first temperature of about 1150° C. for about 10 seconds and a second rapid thermal processing step of maintaining a third temperature of about 1215° C. for about one second, and (d) corresponds to the case of performing no thermal processing step. As shown in FIG. 16a, it can be understood that in the cases of performing the two-step rapid thermal process, the depth of DZ is relatively constant without substantial variation.

In addition, In FIG. 16b, (a) corresponds to the case of performing only the first rapid thermal processing step of maintaining a first temperature of about 1150° C. for about 10 seconds, (b) corresponds to the case of performing only the second rapid thermal processing step of maintaining a third temperature of about 1215° C. for about one second, (c) corresponds to the case of a two-step rapid thermal process comprising a first rapid thermal processing step of maintaining a first temperature of about 1150° C. for about 10 seconds and a second rapid thermal processing step of maintaining a third temperature of about 1215° C. for about one second, and (d) corresponds to the case of performing no thermal processing step. As shown in FIG. 16b, it can be understood that in the cases of performing the two-step rapid thermal process in accordance with the embodiment of the present invention, the depth of DZ is relatively constant without substantial variation.

Figure 17A:
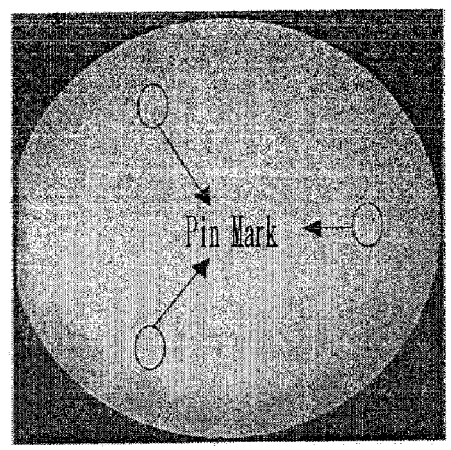
FIGS. 17a to 17c are photographs illustrating results of XRT (X-ray topography) of silicon wafers which are fabricated according to a disclosed embodiment.
Figure 17B:
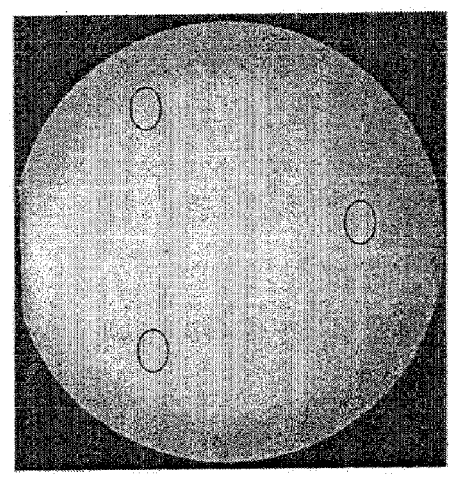
Figure 17C:
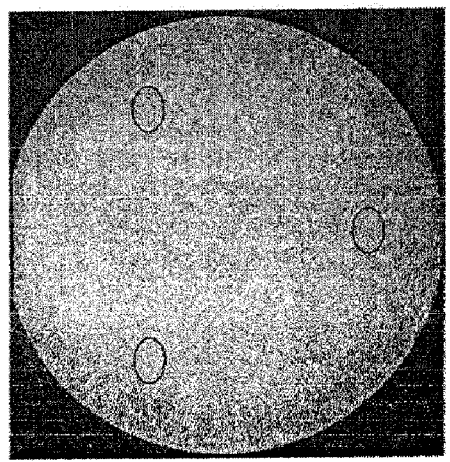

FIGS. 17a to 17b are photographs illustrating results of XRT (X-ray topography) of silicon wafers which are fabricated according to an embodiment of the present invention. As shown in the figures, any slip potential is not generated, but only the pin marks occur due to the RTP apparatus. FIG. 17a is a photograph which is corresponding to the case that the two-step rapid thermal process is performed under the condition C described with reference to FIG. 11, FIG. 17b is a photograph which is corresponding to the case that the two-step rapid thermal process is performed under the condition B described with reference to FIG. 11, and FIG. 17c is a photograph which is corresponding to the case that the two-step rapid thermal process is performed under the condition A described with reference to FIG. 11

Figure 18:
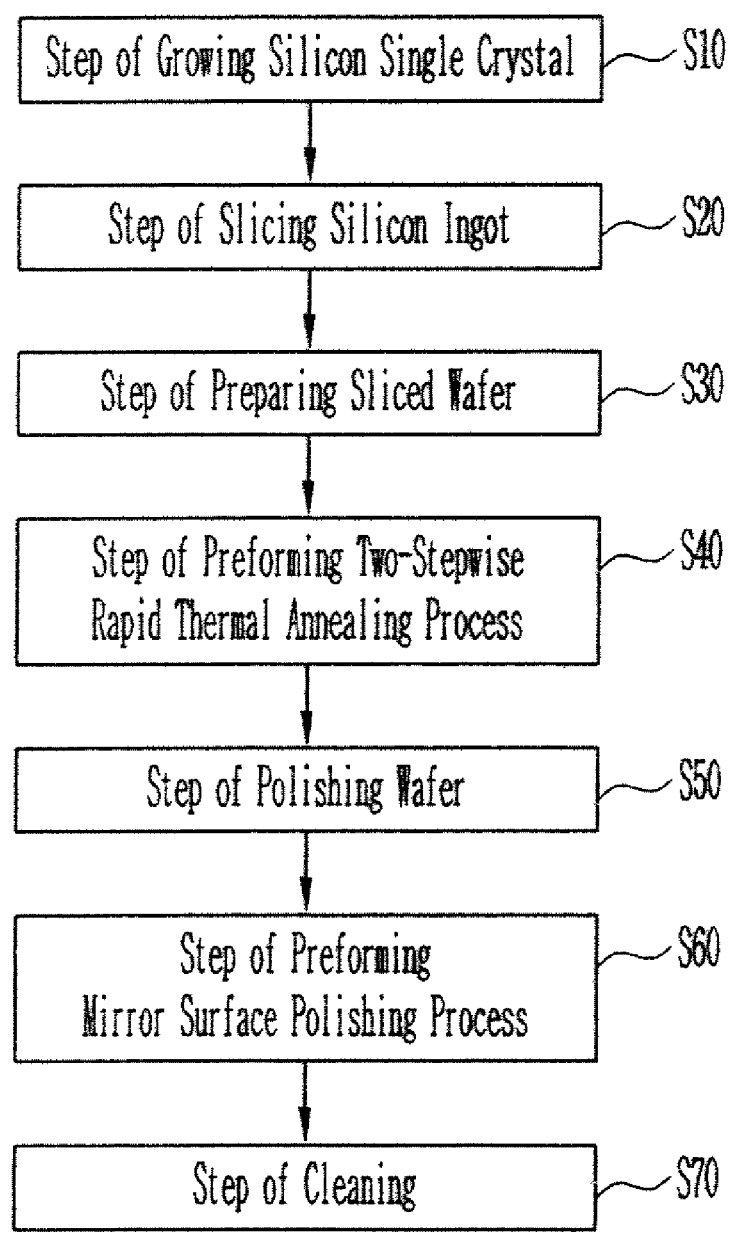
FIG. 18 is a flow diagram explaining the steps for fabricating the silicon wafer according to another disclosed embodiment.

FIG. 18 is a view for explaining the steps for fabricating a silicon wafer according to a disclosed embodiment.

Referring to FIG. 18, firstly, a silicon single crystal is grown in a predetermined pulling apparatus by using the Czochralski method (S10). In other words, the crystal is grown by immersing a seed crystal into a melt silicon and then pulling the seed crystal slowly. In accordance with the crystal growing rates and the temperature gradients in the growing direction at a crystal coagulation interface, different types of defect regions are formed as described above with reference to FIG. 2.

Changes of the vacancy and interstitial silicon behaviors have an influence on these defect regions. Subsequently, the grown ingot is sliced into a shape of wafers (S20). Next, an etching process is performed so that slicing damages originated form the slicing step are removed and a side surface of the sliced wafer is rounded or the surface is etched (S30). Subsequently, in order to prevent the oxygen generated at the time of growing the crystal and contained in the silicon wafer from emitting electrons to function as a donor in the subsequent thermal treatment processes for fabricating the devices, a donor killing process is performed to form oxygen precipitates through a thermal process (S40). In other words, a plurality of the oxygen atoms of about $10^{16}$ atoms/cm$^3$ out of the oxygen atoms of $10^{18}$ atoms/cm$^3$ which are contained into the silicon wafer at the time of growing the crystal are gathered to emit electrons and function as donors in a crystal cooling process.

Although dopants are added for adjusting resitivity of the wafer, a desired resitivity is not able to be obtained due to these donors. Therefore, the donor killing process is performed to form oxygen precipitates in order to prevent the oxygen generated at the time of growing the crystal from functioning as donors. It is preferable that the two-step rapid thermal process is performed during the donor killing process. Next, a polishing process of polishing the surface of the silicon wafer (S50), a mirror surface polishing process of polishing the surface of the silicon wafer like a mirror, and then, a cleaning process are performed. The silicon wafer which is subjected to these processes is packaged, and then provided as a product.

Shortly describing the process of growing the silicon single crystal (S10), a necking step of growing a long small crystal from the seed crystal is performed, and then, a shouldering step of growing the silicon single crystal in a diameter direction to acquire the target diameter of the silicon single crystal. After the shouldering step, the so-called body growing step is performed to grow the crystal until the crystal has a predetermined diameter. When the crystal has the predetermined diameter by the body growing step, the so-called tailing step of gradually reducing the diameter of the crystal is performed to separate the crystal from the melt silicon. The aforementioned crystal growing processes are carried out in a space, referred to as "hot zone." The hot zone means a space where melt silicon and an ingot are contact with each other when the melt silicon is grown into the single crystal ingot in a crystal growing apparatus (grower). The crystal growing apparatus comprises a melting crucible, a heating unit, a heat insulation structure, an ingot pulling unit, a rotational shaft, and so on.

It is therefore possible to obtain a silicon wafer capable of securing sufficient denuded zones near a surface of the wafer and comprising a bulk region of the wafer having a constant concentration distribution of bulk stacking faults over the entire bulk stacking region to function as gettering sites.

According to the disclosed two-step RTP (rapid thermal processing) process, it is possible to fabricate a wafer in which an ideal semiconductor device region is secured by controlling fine oxygen precipitates and OiSFs (Oxidation Induced Stacking Fault) located on the surface region of the wafer. By performing the two-step rapid thermal process, it is possible that the distribution of defects is accurately controlled and an ideal device active zone is formed up to a certain depth from the surface of the wafer. Furthermore, it is possible to maximize the internal gettering (IG) efficiency by enabling the oxygen precipitates to have a high density and enabling the bulk stacking faults to have a constant density in the depth direction in an internal region of the wafer, that is, the bulk region. Like this, by ideally controlling the OiSF ring or the OiSF disk formed on the surface of the wafer or near the surface of the wafer, it is possible to secure an ideal device active region near the surface of the wafer and fabricate the wafer having a constant distribution of the oxygen precipitates and the bulk stacking faults having a high density.

Moreover, by gettering the metallic contaminating substances which are out-diffused in the subsequent thermal treatment processes, etc., due to the bulk stacking faults located sufficiently and constantly in the entire bulk region, it is possible to remarkably reduce the amount of the metallic contaminating substances which are out-diffused toward the surface.

Although the foregoing description has made with reference to certain preferred embodiments, it is to be understood that changes and modifications to the disclosed processes and products derived therefrom may be made by the ordinary skilled in the art without departing from the spirit and scope of this disclosure and the appended claims.

What is claimed is:

1. A method of fabricating a silicon wafer comprising:
preparing a silicon wafer having a front surface, a back surface, a central axis, a circumferential edge portion and a region between the front and back surfaces;
performing a first rapid thermal process to consume vacancies in the silicon wafer, thereby accelerating a formation of nuclei of oxygen precipitates; and,
performing a second rapid thermal process to remove the nuclei of the oxygen precipitates located in a region near the front surface of the silicon wafer and to further accelerate the growth of the nuclei of the oxygen precipitates located in a bulk region of the silicon wafer;
wherein, after the first rapid thermal process and the second rapid thermal process: the region between the front and back surfaces comprises a first denuded zone being formed up to a predetermined distance from the front surface and a second denuded zone being formed up to a predetermined distance from the back surface;
the bulk region is located between the first and second denuded zones; and
a first concentration distribution of defects in the bulk region is maintained substantially constant in an axial direction from the front surface to the back surface.

2. A method of fabricating a silicon wafer according to claim 1, comprising performing the second rapid thermal process at a higher temperature than that of the first rapid thermal process.

3. A method of fabricating a silicon wafer according to claim 1, comprising performing the first rapid thermal process at a temperature in a range from about 1120° C. to about 1180° C.

4. A method of fabricating a silicon wafer according to claim 1, comprising performing the second rapid thermal process at a temperature in a range from about 1200° C. to about 1230° C.

5. A method of fabricating a silicon wafer according to claim 1, comprising performing the first rapid thermal process for a time period in a range from about 1 second to about 5 seconds.

6. A method of fabricating a silicon wafer according to claim 1, comprising performing the second rapid thermal process for a time period in a range from about 1 second to about 10 seconds.

7. A method of fabricating a silicon wafer according to claim 1, wherein the first rapid thermal process utilizes an atmosphere comprising argon and ammonia.

8. A method of fabricating a silicon wafer according to claim 1, comprising performing the first rapid thermal process and the second rapid thermal process in-situ in the same apparatus.

9. A method of fabricating a silicon wafer according to claim 1, comprising performing the first rapid thermal process and the second rapid thermal process ex-situ.

10. A method of fabricating a silicon wafer according to claim 1, wherein the preparing of the silicon wafer further comprises:
   growing a silicon single crystal by immersing a seed crystal into a silicon melt and pulling the seed crystal while controlling a crystal growing rate and a temperature gradient in a growing direction at a crystal coagulation interface;
   slicing the grown silicon single crystal, thereby forming a wafer; and,
   performing an etching process on the wafer to remove slicing damage resulting from the slicing step, thereby rounding the circumferential edge portion of the wafer and/or etching the front and back surfaces of the wafer.

11. A method of fabricating a silicon wafer according to claim 10, wherein:
   the step of growing the silicon single crystal further comprises generating oxygen in the silicon single crystal; and,
   the first and second thermal processes comprise performing a donor killing process for converting the generated oxygen into oxygen precipitates, thereby preventing the generated oxygen from functioning as an electron emission donor in a subsequent thermal treatment process.

12. A method of fabricating a silicon wafer according to claim 1, wherein after the second rapid thermal process, the method further comprises:
   polishing the front and back surfaces of the silicon wafer;
   performing a mirror surface polishing process on the front and back surfaces of the silicon wafer; and,
   cleaning the silicon wafer.

13. A method of fabricating a silicon wafer according to claim 1, wherein the defects are bulk micro-defects (BMD) including oxygen precipitates and bulk stacking faults.

14. A method of fabricating a silicon wafer according to claim 13, wherein the concentration of the defects in the region between the first and the second denuded zones has a distribution which is maintained substantially constant in a range from about $3.0 \times 10^8$ ea/cm$^3$ to about $1.0 \times 10^{10}$ ea/cm$^3$.

15. A method of fabricating a silicon wafer according to claim 13, wherein the first and second denuded zones are substantially free from oxygen precipitates and bulk stacking faults.

16. A method of fabricating a silicon wafer according to claim 1, wherein the defects are bulk stacking faults.

17. A method of fabricating a silicon wafer according to claim 16, wherein the concentration of the defects in the region between the first and the second denuded zones has a distribution which is maintained substantially constant in a range from about $1.0 \times 10^8$ ea/cm$^3$ to $3.0 \times 10^9$ ea/cm$^3$.

18. A method of fabricating a silicon wafer according to claim 16, wherein the first and second denuded zones are substantially free from bulk stacking faults.

19. A method of fabricating a silicon wafer according to claim 1, wherein the depths of the first and the second denuded zones measured from the front and back surfaces respectively are in a range from about 5 μm to about 40 μm.

20. A method of fabricating a silicon wafer according to claim 19, wherein the depths of the first and the second denuded zones are substantially constant in a radial direction from the central axis to the circumferential edge portion.

21. A method of fabricating a silicon wafer according to claim 1, wherein the first concentration distribution of defects in the bulk region has a range of variation of about 10% or less.

22. A method of fabricating a silicon wafer according to claim 1, wherein a second concentration distribution of defects in the bulk region is maintained substantially constant in a radial direction from the central axis to the circumferential edge portion.

23. A method of fabricating a silicon wafer according to claim 22, wherein the second concentration distribution of defects in the bulk region has a range of variation of about 10% or less.

* * * * *